US011634555B2

(12) United States Patent
Inoue et al.

(10) Patent No.: US 11,634,555 B2
(45) Date of Patent: Apr. 25, 2023

(54) COLORED RESIN COMPOSITION, COLORED FILM, COLOR FILTER AND LIQUID CRYSTAL DISPLAY DEVICE

(71) Applicant: Toray Industries, Inc., Tokyo (JP)

(72) Inventors: Yoshihiko Inoue, Otsu (JP); Kazuki Nanbu, Otsu (JP); Takuto Tokuda, Otsu (JP); Ryosuke Aihara, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 472 days.

(21) Appl. No.: 16/645,183

(22) PCT Filed: Sep. 21, 2018

(86) PCT No.: PCT/JP2018/035112
§ 371 (c)(1),
(2) Date: Mar. 6, 2020

(87) PCT Pub. No.: WO2019/059359
PCT Pub. Date: Mar. 28, 2019

(65) Prior Publication Data
US 2021/0115219 A1  Apr. 22, 2021

(30) Foreign Application Priority Data

Sep. 25, 2017  (JP) .............................. JP2017-183230
Nov. 10, 2017  (JP) .............................. JP2017-217264

(51) Int. Cl.
*G03F 7/004* (2006.01)
*G03F 7/028* (2006.01)
(Continued)

(52) U.S. Cl.
CPC .................. *C08K 3/28* (2013.01); *C08F 2/50* (2013.01); *G03F 7/0007* (2013.01);
(Continued)

(58) Field of Classification Search
None
See application file for complete search history.

(56) References Cited

U.S. PATENT DOCUMENTS 8,329,068 B2   12/2012 Inoue et al.
10,324,376 B2   6/2019 Kamemoto et al.
(Continued)

FOREIGN PATENT DOCUMENTS

CN    102985876 A    3/2013
CN    103787655 A  * 5/2014
(Continued)

OTHER PUBLICATIONS

Kamiyama et al. "Preparation of Zirconium nitride powder form Zirconium Chloride (IV)" J. Ceramic Soc., (JPN) vol. 92(1) pp. 29-34 (1984).*

(Continued)

*Primary Examiner* — Martin J Angebranndt
(74) *Attorney, Agent, or Firm* — RatnerPrestia

(57) ABSTRACT

A colored resin composition containing an alkali-soluble resin (A), a colorant (B), an organic solvent (C), and a photosensitizer (D), the colored resin composition containing at least a zirconia compound particle as the colorant (B), wherein the zirconia compound particle contains zirconium nitride having a crystallite size of 10 nm or more and 60 nm or less, and the crystallite size is determined from a half width of a peak derived from a (111) plane in an X-ray diffraction spectrum using a CuKα ray as an X-ray source. The present invention provides a highly sensitive colored resin composition by improving light transmissivity in the ultraviolet region (wavelength 365 nm) generally used in photolithography and by improving a light shielding property in the visible region.

14 Claims, 1 Drawing Sheet

(51) Int. Cl.
  *G03F 7/16*   (2006.01)
  *C08K 3/28*   (2006.01)
  *C08F 2/50*   (2006.01)
  *G03F 7/00*   (2006.01)

(52) U.S. Cl.
  CPC ............ *G03F 7/0045* (2013.01); *G03F 7/028* (2013.01); *G03F 7/168* (2013.01); *C08K 2201/005* (2013.01); *C08K 2201/006* (2013.01)

(56) References Cited

U.S. PATENT DOCUMENTS

| | | | |
|---|---|---|---|
| 10,870,578 B2 * | 12/2020 | Kageyama | ............ C01B 21/076 |
| 10,974,963 B2 * | 4/2021 | Kageyama | .............. G03F 7/105 |
| 2008/0318018 A1 | 12/2008 | Segawa et al. | |
| 2013/0189623 A1 | 7/2013 | Kim et al. | |
| 2014/0011125 A1 | 1/2014 | Inoue et al. | |
| 2019/0367364 A1 * | 12/2019 | Kageyama | ............ C01B 21/076 |

FOREIGN PATENT DOCUMENTS

| | | | | |
|---|---|---|---|---|
| EP | 1475665 | A1 | 11/2004 | |
| JP | 04318816 | A | 11/1992 | |
| JP | 10153703 | A | 6/1998 | |
| JP | 3120476 | B2 | 12/2000 | |
| JP | 2004326094 | A | 11/2004 | |
| JP | 2005077451 | A | 3/2005 | |
| JP | 2005338328 | A | 12/2005 | |
| JP | 2006209102 | A | 8/2006 | |
| JP | 2008260927 | A | 10/2008 | |
| JP | 2009091205 | A | 4/2009 | |
| JP | 2009091205 | A * | 4/2009 | |
| JP | 2009237294 | A | 10/2009 | |
| JP | 2010097210 | A | 4/2010 | |
| JP | 2011227467 | A | 11/2011 | |
| JP | 2015227282 | A * | 12/2015 | ............. B82Y 30/00 |
| JP | 2017222559 | A | 12/2017 | |
| WO | 2012133148 | A1 | 10/2012 | |
| WO | 2017057143 | A1 | 4/2017 | |
| WO | WO-2018037812 | A1 * | 3/2018 | ............. C08F 20/28 |
| WO | WO-2018225318 | A1 * | 12/2018 | ............. B01J 19/088 |

OTHER PUBLICATIONS

Journal of the Surface Science Society of Japan, Dec. 1984, vol. 5(4), 5 pages (partial English translation).

Journal of the Surface Science Society of Japan, Oct. 1987, vol. 8(5), 5 pages (partial English translation).

Iwanami Physics and Chemistry Dictionary, 4 pages (partial English translation).

International Search Report and Written Opinion for International Application No. PCT/JP2018/035112, dated Dec. 25, 2018, 6 pages.

* cited by examiner

COLORED RESIN COMPOSITION, COLORED FILM, COLOR FILTER AND LIQUID CRYSTAL DISPLAY DEVICE

CROSS REFERENCE TO RELATED APPLICATIONS

This is the U.S. National Phase application of PCT/JP2018/035112, filed Sep. 21, 2018, which claims priority to Japanese Patent Application No. 2017-183230, filed Sep. 25, 2017 and Japanese Patent Application No. 2017-217264, filed Nov. 10, 2017, the disclosures of each of these applications being incorporated herein by reference in their entireties for all purposes.

FIELD OF THE INVENTION

The present invention relates to a colored resin composition, a colored film containing the colored resin composition, a color filter, and a liquid crystal display device.

BACKGROUND OF THE INVENTION

In a display device such as a liquid crystal display device, a light shielding film called a black matrix is formed on a transparent substrate such as a glass or plastic sheet in order to prevent deterioration of display characteristics due to light leakage between pixels of red, green, blue, and the like.

As a black matrix, a deposited film of a metal such as chromium, nickel, or aluminum or a metal compound has been conventionally used. As the black matrix containing a metal compound, for example, a black matrix formed of a multilayer film made of a zirconium compound has been proposed (see, for example, Patent Document 1).

In recent years, a technique has been commonly used in which a black matrix is formed by a photolithography method using a photosensitive colored resin composition containing a light shielding material because dimensional and positional accuracy is excellent and pattern formation is easy in the technique. For example, as the colored resin composition having negative photosensitivity, a black resin composition containing an acrylic polymer, an acrylic polyfunctional monomer or oligomer, a photoinitiator, a solvent, and a light shielding material is widely used. As the light shielding material, a carbon black, a titanium black such as a titanium oxynitride or a titanium nitride, a metal oxide such as an iron oxide, or other mixed organic pigments are used.

Up to now, a black resin composition has been proposed containing at least a titanium nitride particle as a light shielding material, and having a diffraction angle 2θ of a peak derived from a (200) plane of the titanium nitride particle of 42.5° or more and 42.8° or less when a CuKα ray is used as an X-ray source (see, for example, Patent Document 2). Furthermore, a photosensitive composition has been proposed containing a specific photopolymerization initiator as a material forming a pattern that has good linearity and is free of peeling and a residue even when the photosensitive composition contains a light shielding material (see, for example, Patent Documents 3 to 4).

PATENT DOCUMENTS

Patent Document 1: Japanese Patent Laid-open Publication No. 10-153703
Patent Document 2: Japanese Patent Laid-open Publication No. 2008-260927
Patent Document 3: Japanese Patent Laid-open Publication No. 2005-338328
Patent Document 4: Japanese Patent Laid-open Publication No. 2005-77451

SUMMARY OF THE INVENTION

In the photolithography of a photosensitive colored resin composition containing a light shielding material using these conventional techniques, however, there is a problem that photocuring or photodissolution at the bottom of a film is insufficient and the sensitivity is reduced particularly when a thick black matrix is formed.

Accordingly, an object of the present invention is to provide a highly sensitive colored resin composition by improving light transmissivity in the ultraviolet region (wavelength 365 nm) generally used in photolithography and by improving a light shielding property in the visible region.

As a result of intensive studies, the present inventors found that the above-mentioned problems can be solved by using a specific particle as a light shielding material of a colored resin composition, and completed the present invention.

That is, the present invention according to exemplary embodiments is a colored resin composition containing an alkali-soluble resin (A), a colorant (B), an organic solvent (C), and a photosensitizer (D), the colored resin composition containing at least a zirconia compound particle as the colorant (B), wherein the zirconia compound particle contains zirconium nitride having a crystallite size of 10 nm or more and 60 nm or less, the crystallite size being determined from a half width of a peak derived from a (111) plane in an X-ray diffraction spectrum using a CuKα ray as an X-ray source.

Furthermore, the present invention according to exemplary embodiments is a method for producing a substrate with a light-shielding pattern, the method including the steps of applying the above-mentioned colored resin composition on a transparent substrate to obtain a coating film, drying the obtained coating film to obtain a dry film, exposing and developing the obtained dry film to pattern the obtained dry film in a desired shape, and exposing the obtained pattern through the transparent substrate.

The colored resin composition according to the present invention has excellent light transmissivity in the ultraviolet region (wavelength 365 nm) and a light shielding property in the visible region. In addition, the colored resin composition has high sensitivity when it has photosensitivity.

DETAILED DESCRIPTION OF EMBODIMENTS OF THE INVENTION

Figure 1:
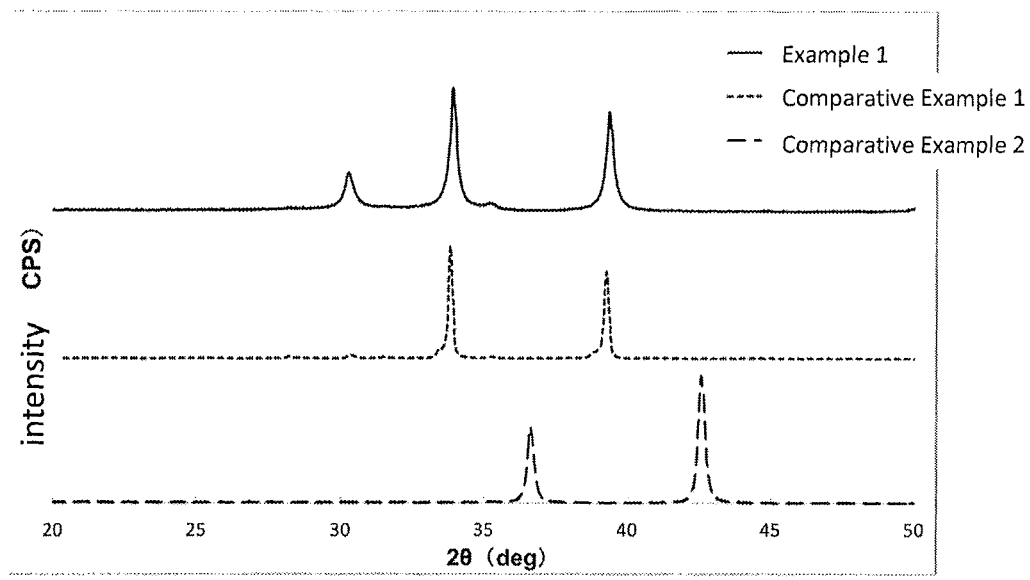
FIG. 1 shows intensity spectra of a diffraction angle 2θ in an X-ray diffraction spectrum obtained by measuring a zirconia compound Zr-1 used in Example 1, a zirconia compound Zr-3 used in Comparative Example 1, or a titanium nitride particle used in Comparative Example 2.
Figure 2:
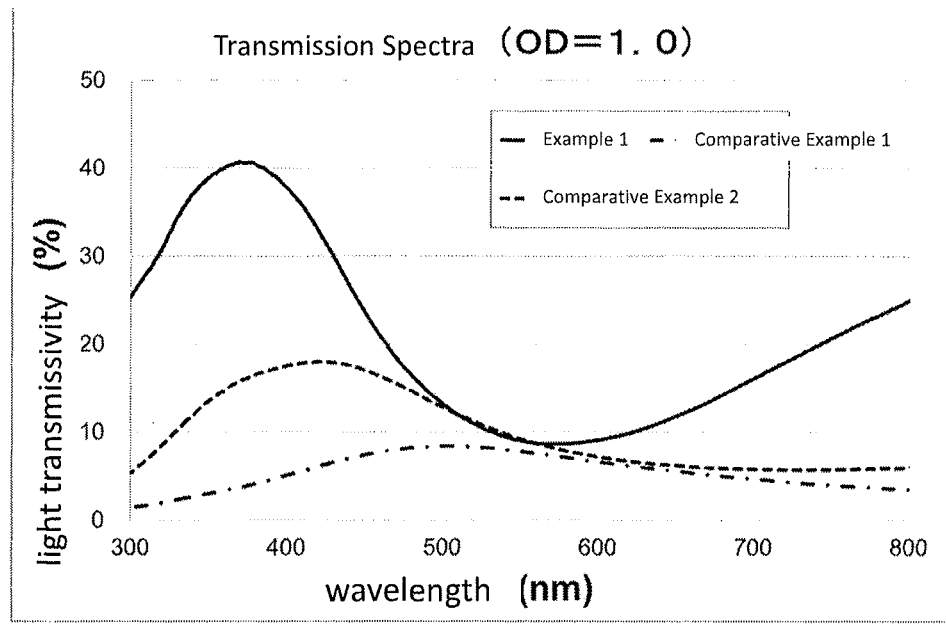
FIG. 2 shows transmission spectra obtained by measuring colored films obtained in Example 1, Comparative Example 1, and Comparative Example 2 using an ultraviolet-visible spectrophotometer.

The colored resin composition according to embodiments of the present invention contains an alkali-soluble resin (A), a colorant (B), an organic solvent (C), and a photosensitizer (D). The colored resin composition contains at least a zirconia compound particle as the colorant (B), wherein the zirconia compound particle contains zirconium nitride having a crystallite size of 10 nm or more and 60 nm or less, and the crystallite size is determined from a half width of a peak derived from a (111) plane using a CuKα ray as an X-ray source. The zirconia compound particle has excellent light transmissivity in the ultraviolet region (wavelength 365 nm). Meanwhile, the zirconia compound particle has an excellent light shielding property because it has low light transmissivity in the visible region. By making the colored resin composition contain the zirconia compound particle as the colorant (B), it is possible to transmit light sufficiently to the bottom of a film in photolithography for photocuring or photodissolution of the colored resin composition, and to make the colored resin composition highly sensitive. Furthermore, since the colored film obtained from the colored resin composition according to the present invention has high ultraviolet transmissivity, other members can be irradiated with ultraviolet rays through the colored film.

The colored resin composition according to embodiments of the present invention has photosensitivity by containing the alkali-soluble resin (A) and the photosensitizer (D). Here, the word "alkali-soluble resin" in the present invention refers to a resin having a hydroxyl group and/or a carboxyl group as an alkali-soluble group, an acid value of 10 mg KOH/g or more, and a weight average molecular weight (Mw) of 500 or more and 150,000 or less. Here, the word "weight average molecular weight (Mw)" refers to a value obtained by analysis by gel permeation chromatography using tetrahydrofuran as a carrier, and by calculation using a standard polystyrene calibration curve.

Examples of the alkali-soluble resin (A) include resins and precursors that satisfy the conditions of the alkali-soluble resin such as cardo resins, acrylic resins, novolac resins, polyimide resins, polyimide precursors, polybenzoxazole resins, polybenzoxazole precursors, polyamide resins, and siloxane resins. When the colored resin composition has negative photosensitivity, resins selected from cardo resins, acrylic resins, and polyimide resins are preferable from the viewpoints of pattern processability and coating film reliability, and acrylic resins are more preferable from the viewpoint of dispersion stability. Meanwhile, when the colored resin composition has positive photosensitivity, resins selected from polyimide resins, polyimide precursors, polybenzoxazole resins, polybenzoxazole precursors, and siloxane resins are preferable from the viewpoint of pattern processability, and polyimide resins or polyimide precursors are more preferable from the viewpoint of the pattern processability.

In the present invention, from the viewpoint of improving heat resistance and the dispersion stability of the colorant, a resin that is not alkali-soluble may be used in combination. Examples of the resin that is not alkali-soluble include resins that do not satisfy the conditions of the alkali-soluble resin such as epoxy resins, acrylic resins, siloxane resins, and polyimide resins. Two or more of these resins may be contained. Among these resins, the acrylic resins or the polyimide resins are preferable from the viewpoints of the storage stability of the colored resin composition and the heat resistance of the colored film.

The colored resin composition according to embodiments of the present invention contains a zirconia compound particle containing zirconium nitride (ZrN) as the colorant (B). By using zirconium nitride as the colorant, it is possible to achieve both the light shielding property in the visible region and the insulation at a high level. In general, the zirconia compound particle contains zirconium oxide ($ZrO_2$), lower zirconium oxides represented by $Zr_nO_{2n-1}$ ($1 \leq n \leq 20$), zirconium oxynitrides represented by $ZrO_xN_y$ ($0 < x < 2.0$, $0.1 < y < 2.0$), and the like as auxiliary components in the production process.

In the X-ray diffraction spectrum of the zirconia compound particle containing zirconium nitride, zirconium oxide and/or zirconium oxynitrides in which a CuKα ray is used as an X-ray source, a peak derived from a (111) plane is observed in the vicinity of a diffraction angle 2θ=33.5 to 34.0° in the case of ZrN. In the case of $ZrO_2$, a peak derived from a (011) plane is observed in the vicinity of a diffraction angle 2θ=30.3°, and a peak derived from a (−111) plane is observed in the vicinity of a diffraction angle 2θ=28.2°. In the case of $Zr_7O_8N_4$, a peak derived from a (211) plane is observed in the vicinity of a diffraction angle 2θ=33.4°. From the half width of these X-ray diffraction peaks, the crystallite size can be calculated by the Scherrer equation shown in Formula (1) below. In the present invention, the crystallite size of the zirconium nitride is calculated.

[Mathematical 1]

$$\text{Crystallite size (nm)} = \frac{K\lambda}{\beta \cos\theta} \quad (1)$$

In the above-mentioned Formula (1), K is a constant 0.9, and λ is 0.15406 [nm]. β is represented by Formula (2) shown below. θ is as described above.

[Mathematical 2]

$$\beta = \sqrt{\beta_e^2 - \beta_o^2} \quad (2)$$

In the above-mentioned Formula (2), $\beta_e$ is the half width of the diffraction peak, and $\beta_o$ is the correction value of the half width (0.12 [°]). R, $\beta_e$, and $\beta_o$ are calculated in the radian.

The X-ray diffraction spectrum is measured by wide-angle X-ray diffraction using a CuKα ray as an X-ray source. As an X-ray diffractometer, RU-200R manufactured by Rigaku Corporation can be used. The measurement conditions are as follows. The output is 50 kV/200 mA, the slit system is 1°-1°-0.15 mm-0.45 mm, the measurement step (2θ) is 0.02°, and the scan speed is 2°/min.

In order to make the effects of the present invention remarkable, the zirconia compound particle containing zirconium nitride preferably contains no zirconium oxide and no zirconium oxynitride that are by-products, and the contents of the zirconium oxide and the zirconium oxynitride are preferably reduced to such an extent that no X-ray diffraction peak is observed.

In the present invention, the zirconia compound particle is preferably a composite particle containing zirconium nitride and a metal particle. By compounding the metal particle with the zirconia nitride, oxidation of the zirconium nitride can be suppressed, and the visible light shielding property and the stability as a particle can be improved.

The word "metal" of the metal particle used in the present invention has a usual meaning in the field of chemistry, for example, described in an item "metal" in "Iwanami Physics and Chemistry Dictionary (5th edition)" (issued by Iwanami Shoten, Publishers in 1998) (444). In Iwanami Physics and Chemistry Dictionary (5th edition), the definition of the word "metal" is described as follows.

"Substances that have metallic luster, are capable of conducting electricity and heat well, and are highly malleable and ductile in the solid state. All the substances except mercury are solid at room temperature. They can usually be subjected to various mechanical processing. When liquefied, they often keep their optical and electrical properties. Most of single metal crystals have any one of a face-centered cubic structure, a hexagonal close-packed structure, and a body-centered cubic structure, and usually form an aggregate of microcrystals. The atoms in the crystal are connected by a * metal bond, and some of the electrons exist as free electrons. The nature of the metal comes from the metal bond. Metals with few free electrons such as simple antimony and bismuth are called * semimetal. Not only simple substances, but also some of phases containing two or more metal elements, or metal elements and certain non-metal elements (boron, carbon, and the like) are metallic. When the temperature increases, electrical conduction of metals decreases but that of non-metals increases, so that metals and non-metals can be separated definitely."

Examples of the metal are not particularly limited, and preferable examples include at least one selected from titanium, aluminum, copper, silver, gold, platinum, palladium, nickel, tin, cobalt, rhodium, iridium, iron, ruthenium, osmium, manganese, molybdenum, tungsten, niobium, tantalum, calcium, titanium, bismuth, antimony, lead, and alloys thereof. More preferable examples include titanium and aluminum.

The content of the metal particle in the zirconia composite particle is preferably 2% by mass or more and 20% by mass or less, and more preferably 3% by mass or more and 10% by mass or less based on the total mass of the zirconia composite particle. By setting the content of the metal particle to 2% by mass or more, the light shielding property can be further improved. Meanwhile, by setting the content of the metal particle to 20% by mass or less, the ultraviolet transmittance can be further improved.

Here, the content of the zirconia atom and the content of the metal atom can be analyzed by ICP atomic emission spectroscopy. The content of the nitrogen atom can be analyzed by inert gas fusion thermal conductivity detection. The content of the oxygen atom can be analyzed by inert gas fusion infrared absorption spectrometry.

In embodiments of the present invention, it is important that the zirconia compound particle contains the zirconium nitride having a crystallite size of 10 nm or more and 60 nm or less, and the crystallite size is calculated from the half width of the X-ray diffraction peak derived from the (111) plane in the X-ray diffraction spectrum using a CuKα ray as an X-ray source. By setting the crystallite size of the zirconium nitride within the above-mentioned range, the transmitted light of the colored film exhibits a bluish purple color having a peak wavelength of 400 nm or less, and the light transmissivity in the ultraviolet region can be improved. Because the colorant containing the zirconia compound particle containing the zirconium nitride has better transmissivity in the ultraviolet region (especially i-line (365 nm)) than conventional light shielding materials, photocuring or photodissolution proceeds sufficiently to the bottom of the film even when the photosensitive colored resin composition is used, and the sensitivity can be improved. When the zirconium nitride has a crystallite size of less than 10 nm, the particle surface is easily oxidized, and the light shielding property is deteriorated. The zirconium nitride more preferably has a crystallite size of 20 nm or more. When the zirconium nitride has a crystallite size of more than 60 nm, however, the transmission peak in the case of the colored film shifts to a long wavelength side, so that the light transmissivity in the ultraviolet region is deteriorated, and the light shielding property in the visible region is also deteriorated. The zirconium nitride preferably has a crystallite size of 50 nm or less, and more preferably 40 nm or less. Examples of the means for setting the crystallite size within the above-mentioned range include a method of adjusting crystal growth conditions during particle synthesis by a gas phase reaction. For example, in a thermal plasma method, the crystallite size can be easily adjusted to the above-mentioned range by adjusting the cooling time and the cooling speed after vaporizing the particle.

The zirconia compound particle preferably has a specific surface area of 5 $m^2/g$ or more and 100 $m^2/g$ or less. By setting the specific surface area of the zirconia compound particle to 5 $m^2/g$ or more, the particle can be easily finely dispersed, and the dispersion stability in the colored resin composition and the flatness and the adhesion of the colored film can be improved. The zirconia compound particle more preferably has a specific surface area of more than 20 $m^2/g$. In addition, when the zirconia compound particle contains no above-mentioned metal particle, the zirconia compound particle more preferably has a specific surface area of more than 29.7 $m^2/g$. Meanwhile, by setting the specific surface area of the zirconia compound particle to 100 $m^2/g$ or less, the reaggregation of the particle can be suppressed, and the dispersion stability in the colored resin composition and the light shielding property of the colored film can be further improved. The zirconia compound particle more preferably has a specific surface area of 60 $m^2/g$ or less. Here, the specific surface area of the zirconia compound particle can be determined by a BET multipoint method based on a nitrogen gas adsorption method using a gas adsorption specific surface area measuring device. Examples of the means for setting the specific surface area within the above-mentioned range include a method of adjusting crystal growth conditions during particle synthesis by a gas phase reaction. For example, in a thermal plasma method, the specific surface area can be easily adjusted to the above-mentioned range by adjusting the cooling time and the cooling speed after vaporizing the particle.

As a method for producing a zirconia compound particle containing zirconium nitride, a gas phase reaction method such as an electric furnace method or a thermal plasma method is generally used. Among these methods, the thermal plasma method is preferable because less impurities are mixed, the zirconia compound particle easily has a uniform particle size, and the productivity is high. Examples of the method for generating thermal plasma include direct current arc discharge, multilayer arc discharge, radio frequency (RF) plasma, and hybrid plasma. Among these methods, the radio frequency plasma is preferable because less impurities from the electrode are mixed. Specific examples of the method include a method in which zirconium is vapored and atomized in a nitrogen atmosphere by a thermal plasma method to synthesize zirconium nitride (for example, Journal of the Surface Science Society of Japan Vol 5 (1984), No. 4), a method in which a gas phase reaction of zirconium chloride with ammonia is caused by an electric furnace method to synthesize zirconium nitride (for example, Journal of the Surface Science Society of Japan Vol 8 (1987), No. 5), and a method in which a mixture of zirconium dioxide, magnesium oxide, and a magnesium metal is calcined at high temperature in a nitrogen atmosphere to obtain lower zirconium oxide-zirconium nitride composite (for example, Japanese Patent Laid-open Publication No. 2009-91205).

As the colorant (B), in addition to the zirconia compound particle containing zirconium nitride, other colorants may be contained as long as the effects of the present invention are not impaired. Examples of the colorants other than the zirconia compound particle include organic pigments, inorganic pigments, and dyes that are commonly used in the field of electronic information materials. In order to improve the heat resistance and the reliability of the colored film, organic pigments or inorganic pigments are preferable.

Examples of the organic pigments include diketopyrrolopyrrole-based pigments; azo-based pigments such as azo, disazo, and polyazo; phthalocyanine-based pigments such as copper phthalocyanine, halogenated copper phthalocyanine, and metal-free phthalocyanine; anthraquinone-based pigments such as aminoanthraquinone, diaminodianthraquinone, anthrapyrimidine, flavanthrone, anthanthrone, indanthrone, pyranthrone, and violanthrone; quinacridone-based pigments; dioxazine-based pigments; perinone-based pigments; perylene-based pigments; thioindigo-based pigments; isoindoline-based pigments; isoindolinone-based pigments; quinophthalone-based pigments; threne-based pigments; and metal complex-based pigments.

Examples of the inorganic pigments include titanium oxide, zinc white, zinc sulfide, white lead, calcium carbonate, precipitated barium sulfate, white carbon, alumina white, kaolin clay, talc, bentonite, black iron oxide, cadmium red, red iron oxide, molybdenum red, molybdate orange, chrome vermilion, chrome yellow, cadmium yellow, yellow iron oxide, titanium yellow, chromium oxide, viridian, cobalt titanate green, cobalt green, cobalt chromium green, victoria green, ultramarine blue, Prussian blue, cobalt blue, cerulean blue, cobalt silica blue, cobalt zinc silica blue, manganese violet, and cobalt violet.

Examples of the dyes include azo dyes, anthraquinone dyes, condensed polycyclic aromatic carbonyl dyes, indigoid dyes, carbonium dyes, phthalocyanine dyes, methine dyes, and polymethine dyes.

Examples of the black colorants include black organic pigments, mixed color organic pigments, and black inorganic pigments. Examples of the black organic pigments include carbon black, perylene black, aniline black, and benzofuranone-based pigments. Examples of the mixed color organic pigments include pigments produced by mixing two or more pigments each having a color of red, blue, green, purple, yellow, magenta, cyan, or the like to make a pseudo black color. Examples of the black inorganic pigments include graphite; particles of metals such as titanium, copper, iron, manganese, cobalt, chromium, nickel, zinc, calcium, and silver; oxides of the above-mentioned metals, composite oxides, sulfides, nitrides, and oxynitrides.

Examples of the white colorants include titanium dioxide, barium carbonate, zirconium oxide, calcium carbonate, barium sulfate, alumina white, and silicon dioxide.

Two or more of these colorants may be contained. Among these colorants, the carbon black is preferable from the viewpoint of further improving the light shielding property of the colored film and adjusting the resistance value, chromaticity, and the like of the colored film. The carbon black has a lower resistance than the zirconia compound particle, so that the resistance value of the colored film can be easily adjusted to a desired range by the mixing ratio of the carbon black to the zirconia compound particle. The carbon black is preferably surface-treated. Meanwhile, as for the chromaticity, the transmission color of the zirconia nitride is bluish purple color whereas that of the carbon black is red, so that black without coloration (neutral black) can be produced by using the zirconia nitride and the carbon black in combination. In addition, titanium nitride, a purple colorant, and the like are preferably contained from the viewpoint of adjusting the light shielding property and the color tone while keeping the transparency in the ultraviolet region. Here, examples of the purple colorant include C.I. pigment violet 1, 1:1, 2, 2:2, 3, 3:1, 3:3, 5, 5:1, 14, 15, 16, 19, 23, 25, 27, 29, 31, 32, 37, 39, 42, 44, 47, 49, and 50. C.I. pigment violet 19 or 23 is preferable, and C.I. pigment violet 23 is more preferable. When a colorant other than the zirconia compound particle is contained, the content of the colorant is preferably about 5 to 75 parts by weight based on 100 parts by weight of the content of the zirconia compound particle.

The content of the colorant (B) in the colored resin composition according to the present invention is preferably 20 to 90 parts by weight based on 100 parts by weight of the total content of the alkali-soluble resin (A) and the colorant (B). When the content of the colorant (B) is 20 parts by weight or more, the colored film can be sufficiently colored. The content of the colorant (B) is more preferably 40 parts by weight or more. Meanwhile, when the content of the colorant (B) is 90 parts by weight or less, the dispersion stability of the colorant (B) can be improved.

Examples of the organic solvent (C) include ethers, acetates, esters, ketones, aromatic hydrocarbons, amides, and alcohols.

Examples of the ethers include ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, dipropylene glycol dimethyl ether, dipropylene glycol methyl-n-butyl ether, tripropylene glycol monomethyl ether, tripropylene glycol monoethyl ether, diethylene glycol dimethyl ether, diethylene glycol methyl ethyl ether, diethylene glycol diethyl ether, and tetrahydrofuran.

Examples of the acetates include butyl acetate, ethylene glycol monomethyl ether acetate, ethylene glycol monoethyl ether acetate, propylene glycol monomethyl ether acetate, 3-methoxybutyl acetate, ethylene glycol monobutyl ether acetate, diethylene glycol monomethyl ether acetate, diethylene glycol monoethyl ether acetate, diethylene glycol monobutyl ether acetate, cyclohexanol acetate, propylene glycol diacetate, propylene glycol monomethyl ether acetate, propylene glycol monoethyl ether acetate (hereinafter "PGMEA"), dipropylene glycol methyl ether acetate, 3-methoxy-3-methyl-1-butyl acetate, 1,4-butanediol diacetate, 1,3-butylene glycol diacetate, and 1,6-hexanediol diacetate.

Examples of the esters include alkyl lactates such as methyl 2-hydroxypropionate and ethyl 2-hydroxypropionate; ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutylpropionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanate.

Examples of the ketones include methyl ethyl ketone, cyclohexanone, 2-heptanone, and 3-heptanone. Examples of the aromatic hydrocarbons include toluene and xylene.

Examples of the amides include N-methylpyrrolidone, N,N-dimethylformamide, and N,N-dimethylacetamide.

Examples of the alcohols include butyl alcohol, isobutyl alcohol, pentanol, 4-methyl-2-pentanol, 3-methyl-2-butanol, 3-methyl-3-methoxybutanol, and diacetone alcohol.

Two or more of these resins may be contained. Among these organic solvents, the acetates are preferable in order to further disperse and stabilize the colorant. The content of the acetates in the organic solvent (C) is preferably 50 to 100% by weight, and more preferably 70 to 100% by weight.

With the increase in the size of the substrate on which a colored film is formed, an application in which a die coating apparatus is used is becoming a major method for applying a colored resin composition on a substrate and obtaining a coating film. From the viewpoint of realizing suitable volatility and a suitable drying property in the application in which a die coating apparatus is used, the colored resin composition preferably contains two or more organic solvents (C). From the viewpoint of uniforming the thickness of the resulting coating film and improving the smoothness and the tackiness of the surface, the organic solvent (C) preferably contains 30 to 75% by weight of an organic solvent having a boiling point of 150 to 200° C.

From the viewpoint of the thickness uniformity of the coating film in the application process, the content of the organic solvent (C) in the colored resin composition according to the present invention is preferably 50% by weight or more, and more preferably 70% by weight or more. Meanwhile, from the viewpoint of suppressing pigment precipitation, the content of the organic solvent (C) is preferably 95% by weight or less, and more preferably 90% by weight or less.

The colored resin composition according to embodiments of the present invention has photosensitivity by containing the alkali-soluble resin (A) and the photosensitizer (D). It is possible that in the colored resin composition according to embodiments of the present invention, the type of the photosensitizer (D) is selected to reduce the alkali solubility of the exposed portion, and the unexposed portion is removed with an alkaline developing solution to form a pattern, that is, the colored resin composition has so-called negative photosensitivity. Meanwhile, it is possible that the alkali solubility of the exposed portion is higher than that of the unexposed portion, and the exposed portion is removed with an alkaline developing solution to form a pattern, that is, the colored resin composition has so-called positive photosensitivity.

The colored resin composition according to the present invention can be provided with the negative photosensitivity, that is, the exposed portion is photocured by a radical polymerization reaction, by containing a photopolymerization initiator as the photosensitizer (D) and further containing the radically polymerizable compound (E).

The word "photopolymerization initiator" refers to a compound that generates a radical by a bond cleavage and/or a reaction by an exposure. By making the colored resin composition contain the photopolymerization initiator, the radically polymerizable compound (E) can be photocured by an exposure.

Examples of the photopolymerization initiator include carbazole-based photopolymerization initiators, acylphosphine oxide-based photopolymerization initiators, oxime ester-based photopolymerization initiators, and α-aminoalkylphenone-based photopolymerization initiators. Two or more of these resins may be contained. Among these photopolymerization initiators, the carbazole-based photopolymerization initiators or the oxime ester-based photopolymerization initiators is preferable because of their high sensitivity to a mixed line including i-line (365 nm), h-line (405 nm), and g-line (436 nm) in the exposure process described below.

From the viewpoint of improving the sensitivity to the exposure, the content of the photopolymerization initiator is preferably 5 parts by weight or more, and more preferably 10 parts by weight or more based on 100 parts by weight of the radically polymerizable compound (E). Meanwhile, from the viewpoint of the deep curability to the exposure, the content of the photopolymerization initiator is preferably 60 parts by weight or less, and more preferably 40 parts by weight or less based on 100 parts by weight of the radically polymerizable compound (E).

The radically polymerizable compound (E) preferably has two or more radically polymerizable groups. From the viewpoint of improving the sensitivity during the exposure and improving the hardness of the cured film, the radically polymerizable compound (E) preferably has a (meth)acrylic group as the radically polymerizable group. Here, the word "(meth)acrylic group" refers to a methacrylic group or an acrylic group.

From the viewpoint of improving the sensitivity to the exposure, the content of the radically polymerizable compound (E) is preferably 5 parts by weight or more, and more preferably 15 parts by weight or more based on 100 parts by weight of the total content of the alkali-soluble resin and the radically polymerizable compound (E). Meanwhile, from the viewpoint of the reflowability in the curing process, the content of the radically polymerizable compound (E) is preferably 80 parts by weight or less, and more preferably 60 parts by weight or less based on 100 parts by weight of the total content of the alkali-soluble resin and the radically polymerizable compound (E).

The negative photosensitive resin composition can have the increased ultraviolet sensitivity by using a cardo resin as the alkali-soluble resin (A). By using such a resin composition, the coating film can be easily subjected to a photolithographic process even when the coating film has a large thickness, and a rectangular colored partition can be formed.

A cardo resin is a resin having a cardo structure, that is, a skeleton structure in which two cyclic structures are bonded to a quaternary carbon atom constituting a cyclic structure.

Specific examples of the skeleton structure in which two cyclic structures are bonded to a quaternary carbon atom constituting a cyclic structure include a fluorene skeleton, a bisphenol fluorene skeleton, a bisaminophenyl fluorene skeleton, a fluorene skeleton having an epoxy group, and a fluorene skeleton having an acrylic group. A common cardo structure is a fluorene ring bonded to a benzene ring.

The cardo resin is formed by polymerizing a skeleton having the cardo structure by, for example, a reaction between functional groups bonded to the skeletons. The cardo resin has a structure in which a main chain and a bulky side chain are connected by one element (cardo structure), and has a cyclic structure in a direction substantially perpendicular to the main chain.

Specific examples of the monomer having a cardo structure include bisphenols containing a cardo structure such as bis(glycidyloxyphenyl)fluorene type epoxy resin, 9,9-bis(4-hydroxyphenyl)fluorene, and 9,9-bis(4-hydroxy-3-methylphenyl)fluorene, 9,9-bis(cyanoalkyl)fluorenes such as 9,9-bis(cyanomethyl)fluorene, and 9,9-bis(aminoalkyl)fluorenes such as 9,9-bis(3-aminopropyl)fluorene.

The cardo resin may be a copolymer with a copolymerizable monomer other than the monomer having a cardo structure. The cardo resin used in the present invention is preferably a cardo resin having an ethylenically unsaturated double bond group. The ethylenically unsaturated double bond group can be easily introduced into the side chain branched from the main chain of the cardo resin. When the cardo resin has an ethylenically unsaturated double bond group, the cardo resin is a photocurable resin, and a three-dimensional crosslinked structure of a carbon-carbon bond is formed by UV curing during the exposure. Therefore, the sensitivity during the exposure can be improved by making the negative photosensitive colored resin composition contain the cardo resin having an ethylenically unsaturated double bond group in the side chain.

The cardo resin preferably contains a structural unit having a carboxylic acid such as a tetracarboxylic acid, a tetracarboxylic dianhydride, a tricarboxylic acid, or a dicarboxylic acid. When the cardo resin contains the structural unit having the carboxylic acid, the cardo resin can be provided with the alkali solubility.

The colored resin composition according to the present invention can be provided with the positive photosensitivity by containing a photoacid generator as the photosensitizer (D) to increase the alkali solubility of the exposed portion relatively.

As the photoacid generator, a quinonediazide compound is preferable. As the quinonediazide compound, an esterified product of a compound having a phenolic hydroxyl group and a quinonediazidesulfonyl acid chloride is more preferable. In order to improve the alkali solubility, some of the phenolic hydroxyl groups may be intentionally left without being esterified.

The content of the quinonediazide compound is preferably 1 to 50 parts by weight based on 100 parts by weight of the alkali-soluble resin (A) from the viewpoint of the pattern processability.

Examples of the alkali-soluble resin (A) preferably used in the positive photosensitive resin composition include polyimides, polyimide precursors, polybenzoxazoles, polybenzoxazole precursors, polyaminoamides, polyamides, polymers obtained from a radically polymerizable monomer having the alkali-soluble group, cardo resins, phenol resins, cyclic olefin polymers, and siloxane resins, but are not limited thereto. Two or more of these resins may be contained. Among these alkali-soluble resins, those having the excellent heat resistance and a small amount of outgas at a high temperature are preferable. Specifically, at least one alkali-soluble resin selected from polyimides, polyimide precursors, and polybenzoxazole precursors, or a copolymer thereof is preferable. These resins are preferably soluble in a low-polarity solvent such as an acetate solvent from the viewpoint of stabilizing the dispersion of the colorant. As the polyimide precursor soluble in a low-polarity solvent, the resin exemplified in WO2017/057143 is preferably used.

The alkali-soluble resin selected from polyimides, polyimide precursors, and polybenzoxazole precursors, or the copolymer thereof that can be used as the alkali-soluble resin (A) preferably has an acidic group in the structural unit of the resin and/or at the main chain terminal so that the alkali-soluble resin or the copolymer is provided with the alkali-solubility. Examples of the acidic group include a carboxyl group, a phenolic hydroxyl group, and a sulfonic acid group. Among these acidic groups, the carboxyl group or the phenolic hydroxyl group is preferable from the viewpoint of containing no sulfur atom.

Furthermore, the alkali-soluble resin preferably contains a fluorine atom, so that in the developing with an alkali aqueous solution, the interface between the film and the substrate can be provided with the water repellency to suppress the penetration of the alkali aqueous solution into the interface. The content of the fluorine atom in the alkali-soluble resin is preferably 5% by weight or more from the viewpoint of the effect of preventing the penetration of the alkali aqueous solution into the interface, and preferably 20% by weight or less from the viewpoint of the solubility in the alkali aqueous solution.

The polyimide preferably has a structural unit represented by General Formula (3) shown below. The polyimide precursor and the polybenzoxazole precursor preferably have a structural unit represented by General Formula (4) shown below. Two or more of these resins may be contained, or a resin produced by copolymerizing the structural unit represented by General Formula (3) and the structural unit represented by General Formula (4) may be used.

[Chem. 1]

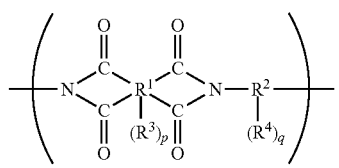

(3)

In General Formula (3), $R^1$ represents a tetravalent to decavalent organic group, and $R^2$ represents a divalent to octavalent organic group. $R^3$ and $R^4$ represent a carboxyl group or a phenolic hydroxyl group, and each may be a single group or a different group by the structural unit. p and q represent an integer of 0 to 6, and p+q>0.

[Chem. 2]

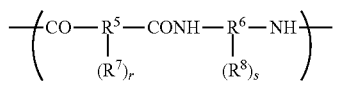

(4)

In General Formula (4), $R^5$ represents a divalent to octavalent organic group, and $R^6$ represents a divalent to octavalent organic group. $R^7$ and $R^8$ represent a phenolic hydroxyl group or COORS, and each may be a single group or a different group by the structural unit. $R^9$ represents a hydrogen atom or a monovalent hydrocarbon group having 1 to 20 carbon atoms. r and s represent an integer of 0 to 6, and r+s>0.

The alkali-soluble resin selected from polyimides, polyimide precursors, and polybenzoxazole precursors, or the copolymer thereof preferably has 5 to 100,000 structural units represented by General Formula (3) or (4) in one molecule. In addition to the structural unit represented by General Formula (3) or (4), another structural unit may be contained. In this case, 50 mol % or more of the structural unit represented by General Formula (3) or (4) based on the total number of the structural units is preferably contained.

In General Formula (3), $R^1$—$(R^3)_p$ represents an acid dianhydride residue. $R^1$ is a tetravalent to decavalent organic group, and preferably an organic group containing an aromatic ring or a cyclic aliphatic group and having 5 to 40 carbon atoms.

Specific examples of the acid dianhydride include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenone tetracarboxylic dianhydride, 2,2',3,3'-benzophenone tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)ether dianhydride, 1,2,5,6-naphthalenetetracarboxylic dianhydride, 9,9-bis(3,4-dicarboxyphenyl)fluorenic dianhydride, 9,9-bis{4-(3,4-dicarboxyphenoxy)phenyl}fluorenic dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl) hexafluoropropane dianhydride, and acid dianhydrides having the structure shown below, and aliphatic tetracarboxylic dianhydrides such as butanetetracarboxylic dianhydride and 1,2,3,4-cyclopentanetetracarboxylic dianhydride. Two or more of these acid dianhydrides may be used.

[Chem. 3]

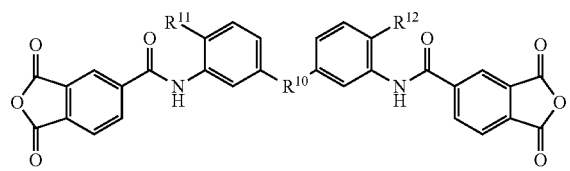

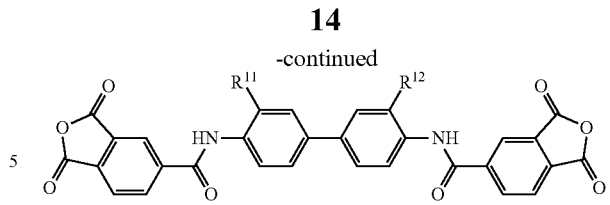

$R^{10}$ represents an oxygen atom, $C(CF_3)_2$, or $C(CH_3)_2$. $R^{11}$ and $R^{12}$ each independently represent a hydrogen atom or a hydroxyl group.

In General Formula (4), $R^5$—$(R^7)_r$ represents an acid residue. $R^5$ is a divalent to octavalent organic group, and preferably an organic group containing an aromatic ring or a cyclic aliphatic group and having 5 to 40 carbon atoms.

Examples of the acid are as follows. Examples of the dicarboxylic acid include terephthalic acid, isophthalic acid, diphenyl ether dicarboxylic acid, bis(carboxyphenyl) hexafluoropropane, biphenyl dicarboxylic acid, benzophenone dicarboxylic acid, and triphenyl dicarboxylic acid; examples of the tricarboxylic acid include trimellitic acid, trimesic acid, diphenyl ether tricarboxylic acid, and biphenyl tricarboxylic acid; examples of the tetracarboxylic acid include pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenone tetracarboxylic acid, 2,2',3,3'-benzophenone tetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, 3,4,9,10-perylenetetracarboxylic acid, aromatic tetracarboxylic acid having the structure shown below, and aliphatic tetracarboxylic acids such as butanetetracarboxylic acid and 1,2,3,4-cyclopentane tetracarboxylic acid. Two or more of these acid dianhydrides may be used.

[Chem. 4]

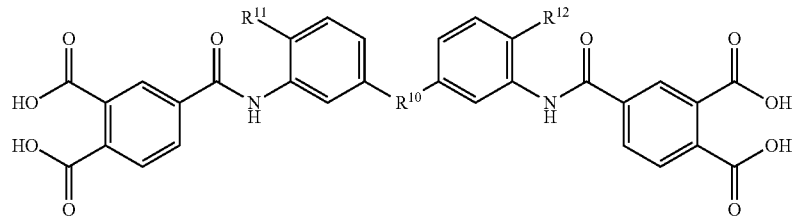

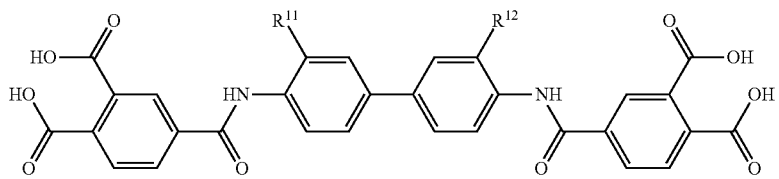

$R^{10}$ represents an oxygen atom, $C(CF_3)_2$, or $C(CH_3)_2$. $R^{11}$ and $R^{12}$ each independently represent a hydrogen atom or a hydroxyl group.

In the tricarboxylic acids and the tetracarboxylic acids among these acids, one or two carboxyl groups correspond to the $R^7$ group in General Formula (4). Furthermore, it is more preferable that one to four hydrogen atoms in the carboxyl groups of the dicarboxylic acids, the tricarboxylic acids, and the tetracarboxylic acids exemplified above are substituted with the $R^7$ group in General Formula (4), preferably with the hydroxyl group. These acids can be used as they are, as acid anhydrides, or as active esters.

$R^2$—$(R^4)_q$ in General Formula (3) and $R^6$—$(R^8)_s$ in General Formula (4) represent a diamine residue. $R^2$ and $R^8$ are a divalent to octavalent organic group, and preferably an organic group containing an aromatic ring or a cyclic aliphatic group and having 5 to 40 carbon atoms.

Specific examples of the diamine include 3,4'-diaminodiphenyl ether, 4,4'-diaminodiphenyl ether, 3,4'-diaminodiphenylmethane, 4,4'-diaminodiphenylmethane, 1,4-bis(4-aminophenoxy)benzene, benzidine, m-phenylenediamine, p-phenylenediamine, 1,5-naphthalenediamine, 2,6-naphthalenediamine, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, a compound in which at least some of the hydrogen atoms in these aromatic rings are substituted with an alkyl group or a halogen atom, aliphatic cyclohexyldiamine, aliphatic methylenebiscyclohexylamine, and diamines having the structure shown below. Two or more of these acid dianhydrides may be used.

[Chem. 5]

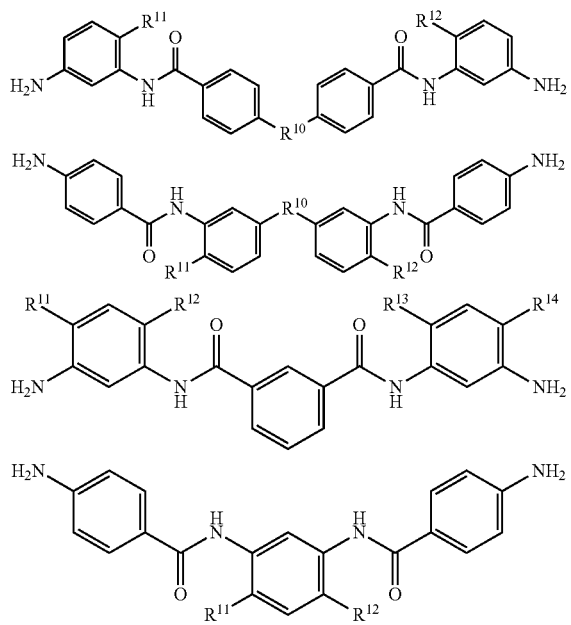

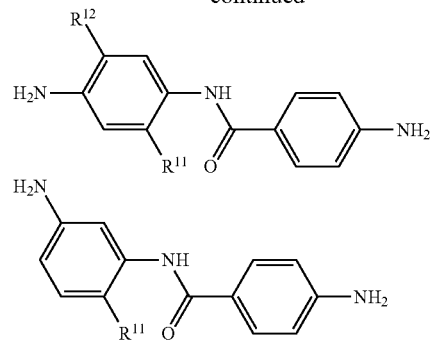

$R^{10}$ represents an oxygen atom, $C(CF_3)_2$, or $C(CH_3)_2$. $R^{11}$ to $R^{14}$ each independently represent a hydrogen atom or a hydroxyl group.

These diamines can be used as diamines, as corresponding diisocyanate compounds, or as corresponding trimethylsilylated diamines.

Furthermore, by blocking the terminal of these resins with a monoamine having an acidic group, with an acid anhydride, with an acid chloride, or with a monocarboxylic acid, a resin having an acidic group at the main chain terminal can be obtained.

Preferable examples of the monoamine include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these acid dianhydrides may be used.

Preferable examples of the acid anhydride, the acid chloride, and the monocarboxylic acid include acid anhydrides such as phthalic anhydride, maleic anhydride, nadic acid anhydride, cyclohexanedicarboxylic acid anhydride, and 3-hydroxyphthalic acid anhydride, monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, and 1-mercapto-5-carboxynaphthalene, monoacid chloride compounds in which these carboxyl groups are converted into an acid chloride, monoacid chloride compounds in which only one carboxyl group of dicarboxylic acids, such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene, are converted into an acid chloride, and active ester compounds produced by reacting a monoacid chloride compound with N-hydroxybenzotriazole or N-hydroxy-5-norbornene-2,3-dicarboximide. Two or more of these acid dianhydrides may be used.

The content of the terminal blocking agents such as the monoamines, acid anhydrides, acid chlorides, and monocarboxylic acids described above is preferably 2 to 25 mol % based on 100 mol % of the total acid and amine components contained in the resin.

The terminal blocking agent introduced into the resin can be easily detected by the following method. For example, the resin into which the terminal blocking agent is introduced is dissolved in an acidic solution, and decomposed into an amine component and an acid component that are constituent units of the resin, and the constituent units are measured by gas chromatography (GC) or NMR to easily detect the terminal blocking agent. Alternatively, the terminal blocking agent can be detected by directly measuring the resin into which the terminal blocking agent is introduced by pyrolysis gas chromatography (PGC), infrared spectrum measurement, or $^{13}$C-NMR spectrum measurement.

The alkali-soluble resin (A) can be synthesized by a known method.

As for a polyamic acid or a polyamic acid ester, examples of the production method for the synthesizing include a method of reacting a tetracarboxylic dianhydride with a diamine compound at a low temperature, a method of producing a diester by a tetracarboxylic dianhydride and an alcohol, and then reacting the diester with an amine in the presence of a condensing agent, and a method of producing a diester by a tetracarboxylic dianhydride and an alcohol, then converting the remaining dicarboxylic acid into an acid chloride, and reacting the acid chloride with an amine.

As for a polyhydroxyamide, it can be produced by a production method of condensation-reacting a bisaminophenol compound with a dicarboxylic acid. Specific examples include a method of reacting a dehydrating condensing agent such as dicyclohexylcarbodiimide (DCC) with an acid and adding a bisaminophenol compound thereto, and a method of dropping a solution of a dicarboxylic acid dichloride into a solution of a bisaminophenol compound containing a tertiary amine such as pyridine.

As for a polyimide, it can be produced by dehydrating and ring-closing the polyamic acid or the polyamic acid ester produced by the above-mentioned method, with means of heating or chemical treatment with acid, base, or the like.

The colored resin composition according to the present invention may contain a polymer dispersant. The word "polymer dispersant" refers to a material having both a pigment affinity group having a chemical bond or an adsorption action to the pigment surface and a polymer chain or group having a solvophilic property. In wet media dispersion treatment, the polymer dispersant improves the wettability of a pigment to a dispersion medium to promote the deagglomeration of the pigment, and stabilizes the particle size and the viscosity by the steric hindrance and/or electrostatic repulsion effect. In addition, the polymer dispersant has an effect of suppressing the occurrence of the color separation during the storage or the application of the colored resin composition.

Examples of the polymer dispersant include polyester-based polymer dispersants, acrylic-based polymer dispersants, polyurethane-based polymer dispersants, polyallylamine-based polymer dispersants, and carbodiimide-based dispersants. The polymer dispersants are classified into dispersants having an amine value of 1 mg KOH/g or more and an acid value of less than 1 mg KOH/g, dispersants having an acid value of 1 mg KOH/g or more and an amine value of less than 1 mg KOH/g, dispersants having an amine value of 1 mg KOH/g or more and an acid value of 1 mg KOH/g or more, and dispersants having an amine value of less than 1 mg KOH/g and an acid value of less than 1 mg KOH/g. Two or more of these resins may be contained.

Among these dispersants, the dispersants having an amine value of 1 mg KOH/g or more are preferable.

Examples of the polymer dispersants having an amine value of 1 mg KOH/g or more and an acid value of less than 1 mg KOH/g include "DISPERBYK" (registered trademark) 102, 160, 161, 162, 2163, 164, 2164, 166, 167, 168, 2000, 2050, 2150, 2155, 9075, and 9077, "BYK" (registered trademark)-LP N6919, "DISPERBYK" (registered trademark)-LP N21116, "DISPERBYK" (registered trademark)-LP N21234 (all of which are manufactured by BYK-Chemie GmbH), "EFKA" (registered trademark) 4015, 4020, 4046, 4047, 4050, 4055, 4060, 4080, 4300, 4330, 4340, 4400, 4401, 4402, 4403, and 4800 (all of which are manufactured by BASF), "AJISPER" (registered trademark) PB711 (manufactured by Ajinomoto Fine-Techno Co., Inc.), and "SOLSPERSE" (registered trademark) 13240, 13940, 20000, 71000, and 76500 (all of which are manufactured by The Lubrizol Corporation).

Examples of the polymer dispersants having an amine value of 1 mg KOH/g or more and an acid value of 1 mg KOH/g or more include "DISPERBYK" (registered trademark) 142, 145, 2001, 2010, 2020, 2025, and 9076, Anti-Terra (registered trademark)-205 (all of which are manufactured by BYK-Chemie GmbH), "SOLSPERSE" (registered trademark) 24000 (manufactured by The Lubrizol Corporation), "AJISPER" (registered trademark) PB821, PB880, and PB881 (all of which are manufactured by Ajinomoto Fine-Techno Co., Inc.), and "SOLSPERSE" (registered trademark) 9000, 11200, 13650, 24000SC, 24000GR, 32000, 32500, 32550, 326000, 33000, 34750, 35100, 35200, 37500, 39000, and 56000 (manufactured by The Lubrizol Corporation).

From the viewpoint of improving the dispersion stability, the content of the polymer dispersant in the colored resin composition according to the present invention is preferably 10 parts by weight or more, and more preferably 20 parts by weight or more based on 100 parts by weight of the colorant (B). Meanwhile, from the viewpoint of improving the heat resistance and the adhesion of the colored film, the content of the polymer dispersant is preferably 100 parts by weight or less, and more preferably 60 parts by weight or less based on 100 parts by weight of the colorant (B).

The colored resin composition according to the present invention may contain a thermal crosslinking agent. By making the colored resin composition contain the thermal crosslinking agent, the finally obtained coating film strength can be improved. Examples of the thermal crosslinking agent include compounds having two or more alkoxymethyl groups and/or methylol groups, and compounds having two or more epoxy groups. Two or more of these resins may be contained.

The colored resin composition according to the present invention may contain a leveling agent. By making the colored resin composition contain the leveling agent, the application property and the surface smoothness of the colored film can be improved. Examples of the leveling agent include anionic surfactants such as ammonium lauryl sulfate and triethanolamine polyoxyethylene alkyl ether sulfate; cationic surfactants such as stearylamine acetate and lauryltrimethylammonium chloride; amphoteric surfactants such as lauryldimethylamine oxide and laurylcarboxylmethylhydroxyethylimidazolium betaine; nonionic surfactants such as polyoxyethylene lauryl ether, polyoxyethylene stearyl ether, and sorbitan monostearate; silicone surfactants having polydimethylsiloxane or the like as a main skeleton; and fluorochemical surfactants. Two or more of these resins may be contained. Examples of the commercially available surfactants include "BYK" (registered trademark)-302, 333, 350, and 392 (all of which are manufactured by BYK-Chemie GmbH).

When a coating film including the colored resin composition according to embodiments of the present invention is formed to have an optical density (OD value) of 1, the coating film preferably has a light transmittance of 20% or more, and more preferably 30% or more at a wavelength of 365 nm. Furthermore, when a colored film including a cured film of the colored resin composition is formed to have an optical density (OD value) of 1, the colored film preferably has a light transmittance of 20% or more, and more preferably 30% or more at a wavelength of 365 nm. The higher the light transmittance at a wavelength of 365 nm at a constant optical density is, the better the light transmissivity in the ultraviolet region and the light shielding property in the visible region are. By setting the light transmittance of the coating film or the colored film at a wavelength of 365 nm within the above-mentioned range, the sensitivity to ultraviolet rays is high, and the pattern processability can be improved. In order to improve the light transmissivity of the coating film or the colored film at a wavelength of 365 nm, it is preferable to reduce $ZrO_2$ that is an impurity contained in the zirconia compound particle, and to select the photosensitizer having a small absorbance coefficient in the ultraviolet region, particularly at a wavelength of 365 nm or more.

The light transmittance of the coating film can be determined by forming a coating film of the colored resin composition on a transparent substrate, and measuring the light transmittance using an ultraviolet-visible spectrophotometer with the light transmittance of the transparent substrate as a reference. The light transmittance of the colored film can be determined by forming a coating film of the colored resin composition on a transparent substrate, drying the coating film with a hot plate or the like, then heat-treating the dried coating film with a hot air oven or the like to obtain a colored film, and measuring the colored film using an ultraviolet-visible spectrophotometer with the light transmittance of the transparent substrate as a reference. As the ultraviolet-visible spectrophotometer used for the measurement, UV-2600 (manufactured by SHIMADZU CORPORATION) is preferable, and as the transparent substrate, Tempax (manufactured by AGC TECHNO GLASS CO., LTD.) that is a translucent glass substrate is preferable. The OD value of the coating film or the colored film can be determined by measuring the intensity of the incident light and the transmitted light of the coating film or the colored film using an optical densitometer (361TVisual; manufactured by X-Rite Inc.), and calculating the OD value from Formula (5) below.

$$\text{OD value} = \log_{10}(I_0/I) \quad \text{Formula (5)}$$

$I_0$: Incident light intensity
$I$: Transmitted light intensity

Furthermore, the ratio of the light transmittance at a wavelength of 365 nm to the light transmittance at a wavelength of 550 nm (365 nm/550 nm) of the coating film is preferably 1.0 or more. When the ratio is 1.0 or more, it is possible to form a pattern having excellent adhesion, high definition and an excellent shape even when the light shielding property is very high. The ratio of the light transmittance (365 nm/550 nm) is more preferably 4.0 or more. In order to increase the ratio of the light transmittance at a wavelength of 365 nm to the light transmittance at a wavelength of 550 nm, it is preferable that $ZrO_2$ that is an impurity contained in the zirconia compound particle is reduced, and a purple pigment is contained.

As the method for producing the colored composition according to embodiments of the present invention, for example, a method is preferable in which a resin solution containing the alkali-soluble resin (A), the colorant (B), and, if necessary, a dispersant and the organic solvent (C) is dispersed using a disperser to prepare a colorant dispersion having a high colorant concentration, furthermore, the alkali-soluble resin (A) and, if necessary, another component such as a photosensitizer is added, and the mixture is stirred. If necessary, filtration may be performed.

Examples of the disperser include ball mills, bead mills, sand grinders, three roll mills, and high speed impact mills. Among these dispersers, bead mills are preferable for the efficient dispersion and the fine dispersion. Examples of the bead mills include coball mills, basket mills, pin mills, and dyno mills. Examples of the bead used in the bead mill include a titania bead, a zirconia bead, and a zircon bead. The bead used in the bead mill preferably has a bead size of 0.03 to 1.0 mm. When the colorant (B) has a small primary particle size and a small particle size of the secondary particle formed by agglomeration of the primary particle, it is preferable to use a fine bead having a size of 0.03 to 0.10 mm. In this case, a bead mill provided with a centrifugal separator capable of separating the fine bead from the dispersion is preferable. Meanwhile, when a colorant containing a coarse particle having about a submicron size is dispersed, it is preferable to use a bead having a size of 0.10 mm or more in order to obtain sufficient crushing force.

The colored film according to the present invention can be produced by curing the colored resin composition according to the present invention. The colored film according to the present invention can be suitably used for producing an electrode (conductor circuit) pattern, a wiring pattern of an electronic component, a light shielding image such as a black matrix, a colored partition, and the like. In order to improve the display characteristics of a color filter used in a color liquid crystal display device or the like, the colored film according to the present invention is preferably used for providing the interval portion of the colored pattern, the peripheral portion, the external light side of the TFT, and the like with a light shielding image (including a black matrix). The colored film is more preferably used in the light shielding film provided for the peripheral portion of a display device such as a liquid crystal display device, an EL display device, and a CRT display device, and used in the latticed or stripe-shaped black portion between red, blue and green colored pixels, and still more preferably used as a black matrix such as a dot-shaped black pattern, a linear black pattern, or the like for TFT light shielding.

The colored film according to the present invention preferably has a light transmittance of 20% or more, and more preferably 30% or more at a wavelength of 365 nm per an optical density (OD value) of 1. When the colored film is formed on a transparent substrate, the light transmittance of the colored film can be determined using an ultraviolet-visible spectrophotometer with the light transmittance of the transparent substrate as a reference.

Next, a method for curing the colored resin composition according to an embodiment of the present invention to form a colored film and a colored partition will be described with reference to an example of a negative photosensitive colored resin composition.

The photosensitive colored resin composition is applied on a substrate to obtain a coating film. Examples of the substrate include transparent substrates such as soda glass, non-alkali glass, and quartz glass; silicon wafers, ceramics, and gallium arsenide substrates. Examples of the application method include spin application using a spinner, spray application, die coating, and roll coating. The thickness of the coating film can be appropriately selected depending on the application method and the like. The thickness after drying is generally 1 to 150 µm.

The obtained coating film is dried to obtain a dry film. Examples of the drying method include drying by heating, air drying, drying under reduced pressure, and infrared irradiation. Examples of the apparatus for drying by heating include ovens and hot plates. The drying temperature is preferably 50 to 150° C., and the drying time is preferably 1 minute to several hours.

The obtained dry film is irradiated with an actinic ray for exposure to obtain an exposed film. Examples of the actinic ray for the irradiation include ultraviolet rays, visible rays, electron rays, and X-rays. The colored resin composition according to the present invention is preferably irradiated with i-line (365 nm), h-line (405 nm), or g-line (436 nm) of a mercury lamp. The exposure process is performed through a mask having a desired pattern in order to obtain the desired pattern by the later development process. In order to form a rectangular pattern, it is preferable to reduce diffracted light generated when ultraviolet rays pass through the mask having the pattern. Specific examples of the exposure method include a method in which a mask and a dry film adhere to each other for exposure, and a method in which a projection-type exposure machine or a highly directional laser source is used.

The obtained exposed film is developed using an alkaline developing solution or the like to remove an unexposed portion and form a patterned colored film (sometimes referred to as a light-shielding pattern). Examples of the alkaline compound used in the alkaline developing solution include inorganic alkalis such as sodium hydroxide, potassium hydroxide, sodium carbonate, potassium carbonate, sodium silicate, sodium metasilicate, and aqueous ammonia; primary amines such as ethylamine and n-propylamine; secondary amines such as diethylamine and di-n-propylamine; tertiary amines such as triethylamine and methyldiethylamine; tetraalkylammonium hydroxides such as tetramethylammonium hydroxide (TMAH); quaternary ammonium salts such as choline; alcoholamines such as triethanolamine, diethanolamine, monoethanolamine, dimethylaminoethanol, and diethylaminoethanol; and organic alkalis such as cyclic amines such as pyrrole, piperidine, 1,8-diazabicyclo[5,4,0]-7-undecene, 1,5-diazabicyclo[4,3,0]-5-nonane, and morpholine.

The concentration of the alkaline compound in the alkaline developing solution is generally 0.01 to 50% by mass, and preferably 0.02 to 1% by mass. In order to improve the pattern shape after the development, 0.1 to 5% by mass of a surfactant such as a nonionic surfactant may be added. Furthermore, when the developing solution is an alkaline aqueous solution, a water-soluble organic solvent such as ethanol, γ-butyrolactone, dimethylformamide, and N-methyl-2-pyrrolidone may be added to the developing solution.

Examples of the developing method include an immersion method, a spray method, and a paddle method. The obtained pattern may be rinsed with pure water or the like.

The pattern obtained by the exposure and the development is preferably further exposed through a transparent substrate. Examples of the radioactive rays and the light source for the exposure include those exemplified in the above-mentioned exposure process for the dry film. In the exposure process through a transparent substrate, the purpose is that the pattern obtained by the exposure and the development is photocured from the back-surface direction, so that the entire surface of the substrate is required to be exposed and a photomask is not necessary. Therefore, the pattern can be exposed while conveyed and the production time can be shortened. The exposure amount is preferably 100 mJ/cm$^2$ or more from the viewpoint of more effectively promoting the photocuring of the light-shielding pattern and further improving the solvent resistance. Meanwhile, the exposure amount is preferably 1000 mJ/cm$^2$ or less from the viewpoint of the productivity.

In the exposure process through a transparent substrate, the pattern is preferably exposed from the opposite side from the transparent substrate simultaneously. By exposing the light-shielding pattern from both the sides, the photocuring can be further promoted, and the solvent resistance can be further improved.

By subjecting the obtained pattern to a heat treatment (post-bake), a patterned colored film can be produced. The heat treatment may be performed in air, in a nitrogen atmosphere, or in a vacuum state. The heating temperature is preferably 100 to 300° C., and the heating time is preferably 0.25 to 5 hours. The heating temperature may be changed continuously or may be changed stepwise.

The color filter according to the present invention preferably has pixels on a substrate and a black matrix between the pixels. The color filter may have a fixed spacer and an overcoat layer as necessary. The colored film according to the present invention may be placed between the pixels as a black matrix, or may be placed on the frame portion of the pixel. By using the colored film according to embodiments of the present invention in the color filter, it is possible to improve the contrast of the obtained liquid crystal display device and prevent the malfunction of the driving element of the liquid crystal display device due to light.

The fixed spacer is fixed to the specific location of the substrate for a liquid crystal display device as disclosed in Patent Laid-open Publication No. 4-318816, and is in contact with the electrode substrate when the liquid crystal display device is produced. The spacer keeps a certain gap between the color filter and the electrode substrate, and liquid crystal is put into the gap. By placing the fixed spacer, it is possible to omit the step of dispersing a spherical spacer and the step of mixing a rod-shaped spacer in a sealing agent in the production process of the liquid crystal display device.

The overcoat layer has a function of flattening a hole and unevenness generated in the pixel and suppressing the elution of a component in the pixel into the liquid crystal layer. Examples of the material for the overcoat layer include epoxy resins, acrylic epoxy resins, acrylic resins, siloxane resins, polyimides, silicon-containing polyimides, and polyimidesiloxanes. On a substrate with unevenness, the thickness of the overcoat layer tends to be thick in the recess (the portion lower than the surroundings) and thin in the protrusion (the portion higher than the surroundings) due to the leveling property of the overcoat layer. The thickness of the overcoat is preferably 0.04 to 3 µm.

The liquid crystal display device according to the present invention preferably includes the color filter according to the embodiments of present invention, an electrode substrate placed to face the color filter, a liquid crystal alignment film provided on each of the color filter and the electrode substrate, a spacer to keep a space between the liquid crystal alignment films, and liquid crystal put into the space.

An example of a method for producing a liquid crystal display device in which the color filter according to embodiments of the present invention is used will be described. The color filter according to an embodiment of the present invention and an electrode substrate are bonded to each other in a state that they face each other interposing a liquid crystal alignment film rubbed for liquid crystal alignment and a spacer for keeping a cell gap. The liquid crystal alignment film and the spacer are provided on the substrates of the color filter and the electrode substrate. On the electrode substrate, a thin film transistor (TFT) element, a thin film diode (TFD) element, a scanning line, a signal line, and the like are provided. Next, liquid crystal is put into the inlet provided in the seal portion, and then the inlet is sealed. A driver IC or the like is mounted to obtain a liquid crystal display device.

The colored film produced by curing the colored resin composition according to an embodiment of the present invention is suitably used as a colored partition for a solid-state imaging device because the colored film can be formed in high definition and in a rectangular shape even when the film is thick. By placing the substrate having the colored partition according to the present invention on the entire surface of the solid-state imaging device, it is possible to reduce incident stray light and improve the sensitivity of the imaging device.

Furthermore, the colored resin composition according to embodiments of the present invention is suitably used in a display device having a color conversion light emitting material between the colored partitions. The color conversion material contained in the pixels separated by the colored partition preferably contains an inorganic phosphor and/or an organic phosphor.

Examples of the inorganic phosphor include YAG-based phosphors, TAG-based phosphors, sialon-based phosphors, $Mn^{4+}$ activated fluoride complex phosphors, and inorganic semiconductors called quantum dots. Two or more of these acid dianhydrides may be used. Among these inorganic phosphors, the quantum dots are preferable. Examples of the quantum dots include II-IV, III-V, IV-VI, and IV group semiconductors. Examples of these inorganic semiconductors include Si, Ge, Sn, Se, Te, B, C (including diamond), P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, and $Al_2O_3$. Two or more of these acid dianhydrides may be used.

Examples of the organic phosphor include perylene-based derivatives, porphyrin-based derivatives, oxazine-based derivatives, and pyrazine-based derivatives. Two or more of these resins may be contained.

A method for producing a display device having a color conversion light emitting material between the colored partitions will be described with reference to an example of a display device having a substrate including the colored partition according to embodiments of the present invention and an organic EL cell. A photosensitive polyimide resin is applied on a glass substrate, and an insulating film is formed by a photolithography method. An aluminum film is formed on the insulating film by sputtering, and then the aluminum film is patterned by a photolithography method to form a back-electrode layer in the opening having no insulating film. Subsequently, tris(8-quinolinolato)aluminum (hereinafter abbreviated as Alq3) is formed as an electron transporting layer by a vacuum deposition method, and a white light emitting layer is formed by doping the Alq3 with a light emitting layer including dicyanomethylenepyran, quinacridone, and 4,4'-bis(2,2-diphenylvinyl)biphenyl. Next, N,N'-diphenyl-N,N'-bis(α-naphthyl)-1,1'-biphenyl-4,4'-diamine is formed as a hole transport layer by a vacuum deposition method. Finally, an ITO film is formed as a transparent electrode by sputtering to produce an organic EL cell having the white light emitting layer. The organic EL cell produced in this manner and the above-mentioned substrate having the colored partition are bonded to each other with a sealant in a state that they face each other to produce a display device.

EXAMPLES

Hereinafter, the present invention will be described in detail with reference to Examples and Comparative Examples, but the aspects of the present invention are not limited thereto.

<Evaluation Method>

[Crystallite Size of Zirconium Nitride and Peak Intensity Ratio $ZrO_2/ZrN$]

The zirconium compound particles Zr-1 to Zr-6 used in Production Examples were each packed in an aluminum standard sample holder, and the X-ray diffraction spectrum was measured by wide-angle X-ray diffraction using RU-200R manufactured by Rigaku Corporation and using a CuKα1 ray as an X-ray source. The measurement conditions were as follows. The output was 50 kV/200 mA, the slit system was 1°-1°-0.15 mm-0.45 mm, the measurement step (2θ) was 0.02°, and the scan speed was 2°/min.

The diffraction angle and the half width of the peak derived from the ZrN (111) plane observed in the vicinity of a diffraction angle 2θ=33.8° was measured, and the crystallite size in the particle was determined using the Scherrer equation shown in Formula (1) above. The results are shown in Table 1.

In addition, the intensity of the peak derived from the ZrN (111) plane observed in the vicinity of a diffraction angle 2θ=33.8° and the intensity of the peak derived from the $ZrO_2$ (011) plane observed in the vicinity of a diffraction angle 2θ=30.3° were determined, and the peak intensity ratio $ZrO_2/ZrN$ was calculated. The results are shown in Table 1.

[Specific Surface Area]

The zirconium compound particles Zr-1 to Zr-6 used in Production Examples were each vacuum-degassed at 100° C. using a high precision fully automatic gas adsorption device "BELSORP" 36 manufactured by BEL Japan, Inc., the adsorption isotherm of $N_2$ gas at a liquid nitrogen temperature (77K) was measured, and the isotherm was analyzed by the BET method to determine the specific surface area. The results are shown in Table 1.

[Content of Metal Particle]

The zirconium compound particles Zr-4 to Zr-6 were each melted and decomposed with an alkali, the melt was dissolved with hydrochloric acid, and the volume was adjusted with ultrapure water to prepare a test solution. The element in the test solution was quantitatively analyzed using ICP-AES (manufactured by SII Nano Technology Inc., SPS5100 type) and the results are shown in Table 1.

TABLE 1

| | | X-ray diffraction spectrum | | | | | |
|---|---|---|---|---|---|---|---|
| | | Diffraction angle 2θ (°) of peak derived from ZrN (111) plane | Half width of peak derived from ZrN (111) plane | Crystallite size (nm) | Peak intensity ratio (%) ZrO$_2$/ZrN | Specific surface area (m$^2$/g) | Content of metal particle |
| Colorant 1 | Zirconia Compound Zr-1 | 33.90 | 0.250 | 35 | 46 | 45.4 | 0 |
| Colorant 2 | Zirconia Compound Zr-2 | 33.94 | 0.239 | 36 | 92 | 29.7 | 0 |
| Colorant 3 | Zirconia Compound Zr-3 | 33.82 | 0.134 | 73 | 7 | 1.1 | 0 |
| Colorant 4 | Zirconia Compound Zr-4 | 33.89 | 0.289 | 32 | 4 | 29.0 | Al: 4 wt % |
| Colorant 5 | Zirconia Compound Zr-5 | 33.88 | 0.402 | 22 | 1 | 58.5 | Al: 4 wt % |
| Colorant 6 | Zirconia Compound Zr-6 | 33.88 | 0.253 | 38 | 3 | 23.0 | Al: 8 wt % |

[Light Shielding Property]

The OD value per a thickness of 1 μm of the colored film obtained in each of Examples and Comparative Examples was calculated using an optical densitometer 361TVisual manufactured by X-Rite Inc.

[Light Transmissivity]

The transmittance of the colored film obtained in each of Examples and Comparative Examples was measured using an ultraviolet-visible spectrophotometer UV-2600 manufactured by SHIMADZU CORPORATION at a film thickness in which the OD value was 1.0 and at wavelengths of 365 nm and 550 nm. The higher the transmittance at a wavelength of 365 nm is, the better the light transmissivity in the ultraviolet region is. In addition, the ratio of the light transmittance at a wavelength of 365 nm to the light transmittance at a wavelength of 550 nm was calculated.

[Flatness]

The surface roughness (nm) of the colored film obtained in each of Examples and Comparative Examples was measured using a contact type film thickness meter ("DEKTAK" (registered trademark) 150; sold by ULVAC, Inc.) at a stylus pressure of 5 mg.

[Negative Sensitivity]

The colored film obtained in each of Examples and Comparative Examples was exposed to ultraviolet rays through a photomask with a maximum exposure amount of 200 mJ/cm$^2$ and with exposure amounts lower by 10 mJ/cm$^2$, and the presence or absence of the roughness on the pattern surface after the shower development with an alkaline developing solution that was 0.045% by weight of potassium hydroxide solution was visually observed. The sensitivity was defined as the minimum exposure amount with which no roughness on the pattern surface after the development was observed. When no pattern remained after the development with the maximum exposure amount, the pattern was regarded as being "missing".

[Minimum Resolution]

The colored film obtained in each of Examples and Comparative Examples was exposed to 200 mJ/cm$^2$ of ultraviolet rays through a photomask in which line-and-space patterns having different pattern widths were placed at a one-to-one spacing, and the pattern was observed with a microscope after the shower development with a predetermined alkaline developing solution. The minimum resolution was defined as the minimum line width at which the pattern after the development was resolved.

[Positive Sensitivity]

The colored film obtained in each of Examples and Comparative Examples was exposed with a maximum exposure amount of 200 mJ/cm$^2$ and with exposure amounts lower by 10 mJ/cm$^2$ through a photomask in which a line-and-space pattern having a line width of 20 μm and a one-to-one spacing was placed, and the pattern and the line width of the space was observed with a microscope after the shower development with a predetermined alkaline developing solution. The sensitivity was defined as the minimum exposure amount with which the line-and-space pattern was formed at one-to-one. When undissolved material remained in the space pattern portion after the development with the maximum exposure amount, the undissolved material was regarded as "residue".

[Solvent Resistance]

The OD value of the light-shielding pattern obtained in each of Examples and Comparative Examples was measured after wiping the surface for 15 seconds with a nonwoven fabric soaked in propylene glycol monomethyl ether acetate (hereinafter referred to as "PGMEA") in the same manner as in [Light Shielding Property] above. The closer the OD value after the wiping is to the OD value before the wiping (4.0), the better the solvent resistance is.

Synthesis Example 1 Synthesis of Acrylic Resin (P-1)

A methyl methacrylate/methacrylic acid/styrene copolymer (weight ratio 30/40/30) was synthesized by the method described in Example 1 of Japanese Patent No. 3120476. To 100 parts by weight of the obtained copolymer, 40 parts by weight of glycidyl methacrylate was added. The product was reprecipitated with purified water, filtered out, and dried to obtain an alkali-soluble acrylic resin (P-1) having a weight average molecular weight of 15,000 and an acid value of 110 mg KOH/g.

Synthesis Example 2 Synthesis of Polyamide Ester Resin (P-3)

In 100 mL of acetone and 17.4 g (0.3 mol) of propylene oxide (manufactured by Tokyo Chemical Industry Co., Ltd.), 18.3 g (0.05 mol) of 2,2-bis(3-amino-4-hydroxyphenyl) hexafluoropropane (manufactured by Central Glass Co., Ltd.) was dissolved, and the resulting solution was cooled to −15° C. To the cooled solution, a solution prepared by dissolving 20.4 g (0.11 mol) of 3-nitrobenzoyl chloride (manufactured by Tokyo Chemical Industry Co., Ltd.) in 100 mL of acetone was added dropwise. After the termination of the dropping, the resulting solution was stirred at −15° C. for 4 hours and then returned to room temperature. The precipitated white solid was filtered out and vacuum-dried at 50° C.

In a 300 mL stainless steel autoclave, 30 g of the obtained white solid was put and dispersed in 250 mL of methyl cellosolve, and 2 g of 5% palladium-carbon (manufactured by Wako Pure Chemical Industries, Ltd.) was added. Here, hydrogen was introduced with a balloon and the reduction reaction was carried out at room temperature. After about 2 hours, the reaction was terminated by confirming that the balloon did not deflate any more. After the termination of the reaction, the palladium compound as a catalyst was filtered out and removed, and the filtrate was concentrated with a rotary evaporator to obtain a diamine compound (α) represented by Formula (6) shown below.

[Chem. 6]

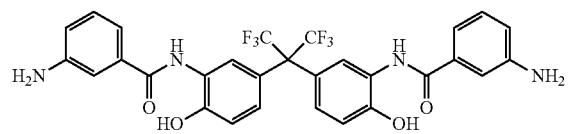

(6)

Under a dry nitrogen stream, 15.1 g (0.025 mol) of the diamine compound (α), 3.62 g (0.01 mol) of 2,2-bis(3-amino-4-methylphenyl)hexafluoropropane (manufactured by Central Glass Co., Ltd.), and 0.62 g (0.0025 mol) of 1,3-bis(3-aminopropyl)tetramethyldisiloxane (manufactured by Shin-Etsu Chemical Co., Ltd.) were dissolved in 200 g of N-methyl-2-pyrrolidone. Here, 22.2 g (0.05 mol) of 2,2-bis(3,4-dicarboxyphenyl) hexafluoropropane dianhydride (manufactured by DAIKIN INDUSTRIES, LTD.) was added together with 50 g of N-methyl-2-pyrrolidone, and the mixture was stirred at 40° C. for 1 hour. Then, 2.73 g (0.025 mol) of 3-aminophenol (manufactured by Tokyo Chemical Industry Co., Ltd.) was added and the mixture was stirred at 40° C. for 1 hour. Furthermore, a solution obtained by diluting 11.9 g (0.1 mol) of N,N-dimethylformamide dimethylacetal (manufactured by Mitsubishi Rayon Co., Ltd.) with 5 g of N-methyl-2-pyrrolidone was added dropwise over 10 minutes. After the dropping, the resulting solution continued to be stirred at 40° C. for 2 hours. After the termination of the stirring, the solution was put into 2 L of water, and the polymer solid precipitate was collected by filtration. Furthermore, the collected precipitate was washed 3 times with 2 L of water, and the collected polymer solid was dried with a vacuum dryer at 50° C. for 72 hours to obtain a polyamic acid ester resin (P-3).

Synthesis Example 3 Synthesis of Quinonediazide Compound (b-1)

Under a dry nitrogen stream, 21.22 g (0.05 mol) of TrisP-PA (trade name, manufactured by Honshu Chemical Industry Co., Ltd.) and 26.8 g (0.1 mol) of 5-naphthoquinone diazide sulfonic acid chloride (manufactured by Toyo Gosei Co., Ltd., NAC-5) were dissolved in 450 g of 1,4-dioxane, and the temperature was controlled to room temperature. Here, 12.65 g of triethylamine mixed with 50 g of 1,4-dioxane was added dropwise in the state that the temperature inside the system would not exceed 35° C. After the dropping, the resulting solution was stirred at 40° C. for 2 hours. The triethylamine salt was filtered out and the filtrate was put into water. Then, the precipitate was collected by filtration and further washed with 1 L of 1% aqueous hydrochloric acid. The washed precipitate was further washed twice with 2 L of water. The precipitate was dried with a vacuum dryer to obtain a quinonediazide compound (b-1) represented by Formula (7) shown below.

[Chem. 7]

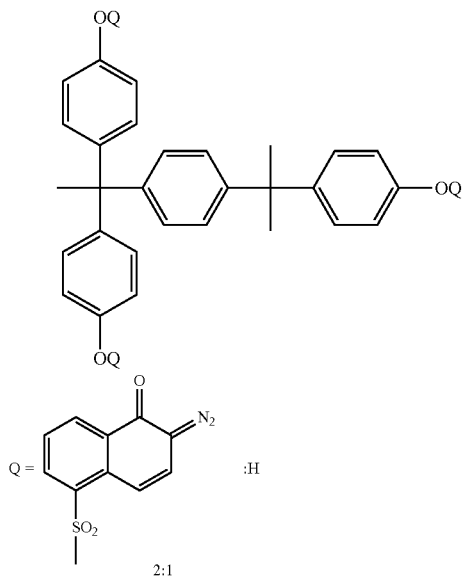

(7)

Production Example 1 Production of Colorant Dispersion (DC-1)

As a colorant, a zirconia compound particle Zr-1 (manufactured by NISSHIN ENGINEERING INC.) produced by a thermal plasma method was used. Into a tank, 200 g of Zr-1, 114 g of 35% by weight solution of an acrylic polymer (P-1) of propylene glycol monomethyl ether acetate (PGMEA), 25 g of "DISPERBYK" (registered trademark) LPN-21116 having a tertiary amino group and a quaternary ammonium salt as a polymer dispersant, and 661 g of PGMEA were put, and the mixture was stirred with a homomixer for 20 minutes to obtain a preliminary dispersion. The obtained preliminary dispersion was supplied to a disperser Ultra Apex Mill manufactured by Kotobuki Industries Co., Ltd. equipped with a centrifugal separator filled with 75% by volume of a 0.05 mmφ zirconia bead, and dispersed for 3 hours at a rotational speed of 8 m/s to obtain a colorant dispersion DC-1 having a solid content concentration of 25% by weight and a colorant/resin (weight ratio) of 80/20.

Production Example 2 Production of Colorant Dispersion (DC-2)

A colorant dispersion (DC-2) was obtained in the same manner as in Production Example 1 except that a zirconium compound particle Zr-2 produced by the method described in Japanese Patent Laid-open Publication No. 2009-91205 was used as the colorant.

Production Example 3 Production of Colorant Dispersion (DC-3)

A colorant dispersion (DC-3) was obtained in the same manner as in Production Example 1 except that a zirconia compound particle Zr-4 (aluminum content=4% by weight, BET surface area=29.0 $m^2/g$) that is a composite particle including zirconium nitride produced by a thermal plasma method and an aluminum particle was used as the colorant.

Production Example 4 Production of Colorant Dispersion (DC-4)

A colorant dispersion (DC-4) was obtained in the same manner as in Production Example 1 except that a zirconia compound particle Zr-5 (aluminum content=4% by weight, BET surface area=58.5 $m^2/g$) that is a composite particle including zirconium nitride produced by a thermal plasma method and an aluminum particle was used as the colorant.

Production Example 5 Production of Colorant Dispersion (DC-5)

A colorant dispersion (DC-5) was obtained in the same manner as in Production Example 1 except that a zirconia compound particle Zr-6 (aluminum content=8% by weight, BET surface area=23.0 $m^2/g$) that is a composite particle including zirconium nitride produced by a thermal plasma method and an aluminum particle was used as the colorant.

Production Example 6 Production of Colorant Dispersion (DC-6)

Into a tank, 200 g of a zirconia compound particle Zr-1 (manufactured by NISSHIN ENGINEERING INC.) produced by a thermal plasma method, 114 g of 35% by weight solution of a polyamide ester resin (P-3) of propylene glycol monomethyl ether acetate (PGMEA), g of "DISPERBYK" (registered trademark)-2200 having an amide group as a polymer dispersant, and 661 g of PGMEA were put, and the mixture was stirred with a homomixer for 20 minutes to obtain a preliminary dispersion. The obtained preliminary dispersion was supplied to a disperser Ultra Apex Mill manufactured by Kotobuki Industries Co., Ltd. equipped with a centrifugal separator filled with 75% by volume of a 0.05 mmφ zirconia bead, and dispersed for 3 hours at a rotational speed of 8 m/s to obtain a colorant dispersion DC-6 having a solid content concentration of 25% by weight and a colorant/resin (weight ratio) of 80/20.

Production Example 7 Production of Colorant Dispersion (DC-7)

A colorant dispersion (DC-7) was obtained in the same manner as in Production Example 6 except that a zirconia compound particle Zr-4 (aluminum content=4% by weight, BET surface area=29.0 $m^2/g$) that is a composite particle including zirconium nitride produced by a thermal plasma method and an aluminum particle was used as the colorant.

Production Example 8 Production of Colorant Dispersion (DC-8)

A colorant dispersion (DC-8) was obtained in the same manner as in Production Example 1 except that an organic purple pigment PV23 (manufactured by Clariant) was used as the colorant.

Production Example 9 Production of Colorant Dispersion (DC-9)

A colorant dispersion (DC-9) was obtained in the same manner as in Production Example 1 except that a commercially available zirconium nitride particle Zr-3 (manufactured by JAPAN NEW METALS CO., LTD.) was used as the colorant.

Production Example 10 Production of Colorant Dispersion (DC-10)

A colorant dispersion (DC-10) was obtained in the same manner as in Production Example 1 except that a titanium nitride particle (manufactured by NISSHIN ENGINEERING INC.) was used as the colorant.

Production Example 11 Production of Colorant Dispersion (DC-11)

A colorant dispersion (DC-11) was obtained in the same manner as in Production Example 1 except that a carbon black (TPK1227 manufactured by Cabot Corporation) whose surface was modified with a sulfonic acid group was used as the colorant.

Production Example 12 Production of Colorant Dispersion (DC-12)

A colorant dispersion (DC-12) was obtained in the same manner as in Production Example 6 except that a carbon black (TPK1227 manufactured by Cabot Corporation) whose surface was modified with a sulfonic acid group was used as the colorant.

Example 1

In 283.1 g of a colorant dispersion (DC-1), 184.4 g of 35% by weight solution of PGMEA of an acrylic polymer (P-1), 50.1 g of dipentaerythritol hexaacrylate (manufactured by Nippon Kayaku Co., Ltd.) as a polyfunctional monomer, 7.5 g of "Irgacure" (registered trademark) 907 (manufactured by BASF) and 3.8 g of "KAYACURE" (registered trademark) DETX-S (manufactured by Nippon Kayaku Co., Ltd.) as photopolymerization initiators, 12.0 g of KBM5103 (manufactured by Shin-Etsu Chemical Co., Ltd.) as an adhesion improving agent, and a solution obtained by dissolving 3 g of 10% by weight solution of PGMEA of a silicone surfactant "BYK" (registered trademark) 333 (manufactured by BYK-Chemie GmbH) in 456.1 g of PGMEA as a surfactant were added to obtain a negative photosensitive colored resin composition PC-1 having a total solid content concentration of 20% by weight and a colorant/resin (weight ratio) of 30/70.

The obtained colored resin composition PC-1 was applied on a non-alkali glass substrate (AN100) using a spinner (1H-DS) manufactured by MIKASA Co., Ltd., and the resulting coating film was heat-dried on a hot plate at 100° C. for 2 minutes. The dry film was exposed to ultraviolet rays with an exposure amount of 200 mJ/cm$^2$ through a negative mask manufactured by HOYA CORPORATION (stripe design line width 50 μm) using a mask aligner (PEM-6M) manufactured by Union Optical Co., Ltd. Next, the exposed film was developed using an alkaline developing solution of 0.045% by weight of potassium hydroxide aqueous solution and then washed with pure water to obtain a patterning substrate. The obtained patterning substrate was post-baked in a hot air oven at 230° C. for 30 minutes to obtain a colored film C-1. Table 2 shows the results of evaluating the colored film C-1 by the method described above.

Example 2

A negative photosensitive colored resin composition PC-2 was obtained in the same manner as in Example 1 except that a colorant dispersion (DC-2) was used instead of the colorant dispersion (DC-1). The obtained colored resin composition PC-2 was used to evaluate in the same manner as in Example 1. The results are shown in Table 2.

Example 3

In 187.0 g of a colorant dispersion (DC-1), 226.8 g of 35% by weight solution of PGMEA of an acrylic polymer (P-1), 57.6 g of dipentaerythritol hexaacrylate (manufactured by Nippon Kayaku Co., Ltd.) as a polyfunctional monomer, 8.6 g of "Irgacure" (registered trademark) 907 (manufactured by BASF) and 4.3 g of "KAYACURE" (registered trademark) DETX as photopolymerization initiators, 12.0 g of KBM5103 (manufactured by Shin-Etsu Chemical Co., Ltd.) as an adhesion improving agent, and a solution obtained by dissolving 3 g of 10% by weight PGMEA solution of a silicone surfactant "BYK" (registered trademark) 333 (manufactured by BYK-Chemie GmbH) in 500.7 g of PGMEA as a surfactant were added to obtain a negative photosensitive colored resin composition PC-3 having a total solid content concentration of 20% by weight and a colorant/resin (weight ratio) of 20/80. The obtained colored resin composition PC-3 was used to evaluate in the same manner as in Example 1. The results are shown in Table 2.

Example 4

In 380.9 g of a colorant dispersion (DC-1), 141.2 g of 35% by weight solution of PGMEA of an acrylic polymer (P-1), 42.5 g of dipentaerythritol hexaacrylate (manufactured by Nippon Kayaku Co., Ltd.) as a polyfunctional monomer, 6.4 g of "Irgacure" (registered trademark) 907 (manufactured by BASF) and 3.2 g of "KAYACURE" (registered trademark) DETX as photopolymerization initiators, 12.0 g of KBM5103 (manufactured by Shin-Etsu Chemical Co., Ltd.) as an adhesion improving agent, and a solution obtained by dissolving 3 g of 10% by weight PGMEA solution of a silicone surfactant "BYK" (registered trademark) 333 (manufactured by BYK-Chemie GmbH) in 410.8 g of PGMEA as a surfactant were added to obtain a negative photosensitive colored resin composition PC-4 having a total solid content concentration of 20% by weight and a colorant/resin (weight ratio) of 40/60. The obtained colored resin composition PC-4 was used to evaluate in the same manner as in Example 1. The results are shown in Table 2.

Example 5

A negative photosensitive colored resin composition PC-5 was obtained in the same manner as in Example 1 except that a colorant dispersion (DC-3) was used instead of the colorant dispersion (DC-1). The obtained colored resin composition PC-5 was used to evaluate in the same manner as in Example 1. The results are shown in Table 2.

Example 6

A negative photosensitive colored resin composition PC-6 was obtained in the same manner as in Example 1 except that a colorant dispersion (DC-4) was used instead of the colorant dispersion (DC-1). The obtained colored resin composition PC-6 was used to evaluate in the same manner as in Example 1. The results are shown in Table 2.

Example 7

A negative photosensitive colored resin composition PC-7 was obtained in the same manner as in Example 1 except that a colorant dispersion (DC-5) was used instead of the colorant dispersion (DC-1). The obtained colored resin composition PC-7 was used to evaluate in the same manner as in Example 1. The results are shown in Table 2.

Example 8

A negative photosensitive colored resin composition PC-8 was obtained in the same manner as in Example 1 except that a mixture of 212.3 g of the colorant dispersion (DC-1) and 70.8 g of a colorant dispersion (DC-8) was used as the colorant dispersion. The obtained colored resin composition PC-8 was used to evaluate in the same manner as in Example 1. The results are shown in Table 2.

Comparative Example 1

A negative photosensitive colored resin composition PC-9 was obtained in the same manner as in Example 1 except that a colorant dispersion (DC-9) was used instead of the colorant dispersion (DC-1). The obtained colored resin composition PC-9 was used to evaluate in the same manner as in Example 1. The results are shown in Table 2.

Comparative Example 2

A negative photosensitive colored resin composition PC-10 was obtained in the same manner as in Example 1 except that a colorant dispersion (DC-10) was used instead of the colorant dispersion (DC-1). The obtained colored resin composition PC-10 was used to evaluate in the same manner as in Example 1. The results are shown in Table 2.

Comparative Example 3

A negative photosensitive colored resin composition PC-11 was obtained in the same manner as in Example 1 except that a colorant dispersion (DC-11) was used instead of the colorant dispersion (DC-1). The obtained colored resin composition PC-11 was used to evaluate in the same manner as in Example 1. The results are shown in Table 2.

TABLE 2

| Colored resin composition | | Colored resin composition | | | | | Results of evaluating colored film Light shielding property OD/μm |
|---|---|---|---|---|---|---|---|
| | | Resin (A) | Colorant (B) | Organic solvent (C) | Polymer dispersant | Colorant/ resin ratio | |
| Example 1 | PC-1 | P-1 | Zirconia compound Zr-1 | PGMEA | LPN21116 | 30/70 | 1.4 |
| Example 2 | PC-2 | P-1 | Zirconia compound Zr-2 | PGMEA | LPN21116 | 30/70 | 0.7 |
| Example 3 | PC-3 | P-1 | Zirconia compound Zr-1 | PGMEA | LPN21116 | 20/80 | 0.8 |
| Example 4 | PC-4 | P-1 | Zirconia compound Zr-1 | PGMEA | LPN21116 | 40/60 | 2.1 |
| Example 5 | PC-5 | P-1 | Zirconia compound Zr-4 | PGMEA | LPN21116 | 30/70 | 1.8 |
| Example 6 | PC-6 | P-1 | Zirconia compound Zr-5 | PGMEA | LPN21116 | 30/70 | 1.5 |
| Example 7 | PC-7 | P-1 | Zirconia compound Zr-6 | PGMEA | LPN21116 | 30/70 | 1.7 |
| Example 8 | PC-8 | P-1 | Zirconia compound Zr-1 + PV23 | PGMEA | LPN21116 | 30/70 | 1.9 |
| Comparative Example 1 | PC-9 | P-1 | Zirconia compound Zr-3 | PGMEA | LPN21116 | 30/70 | 0.8 |
| Comparative Example 2 | PC-10 | P-1 | Titanium nitride particle Ti-1 | PGMEA | LPN21116 | 30/70 | 1.9 |
| Comparative Example 3 | PC-11 | P-1 | Carbon black CB-1 | PGMEA | LPN21116 | 30/70 | 1.7 |

| | Results of evaluating colored film | | | | |
|---|---|---|---|---|---|
| | Light transmissivity (Transmittance @365 nm) | Light transmissivity (Transmittance @550 nm) | Transmittance ratio 365 nm/550 nm | Flatness (Surface roughness) | Negative sensitivity |
| Example 1 | 40% | 9% | 4.4 | 2.5 nm | 70 mJ/cm$^2$ |
| Example 2 | 26% | 11% | 2.4 | 4.3 nm | 70 mJ/cm$^2$ |
| Example 3 | 44% | 11% | 4.0 | 2.1 nm | 50 mJ/cm$^2$ |
| Example 4 | 44% | 10% | 4.4 | 2.9 nm | 90 mJ/cm$^2$ |
| Example 5 | 43% | 9% | 4.8 | 2.4 nm | 60 mJ/cm$^2$ |
| Example 6 | 42% | 10% | 4.2 | 2.0 nm | 70 mJ/cm$^2$ |
| Example 7 | 42% | 9% | 4.7 | 2.3 nm | 60 mJ/cm$^2$ |
| Example 8 | 47% | 4% | 11.8 | 2.4 nm | 70 mJ/cm$^2$ |
| Comparative Example 1 | 4% | 8% | 0.5 | 8.4 nm | Missing |
| Comparative Example 2 | 15% | 9% | 1.7 | 2.5 nm | 120 mJ/cm$^2$ |
| Comparative Example 3 | 2% | 9% | 0.2 | 2.8 nm | Missing |

It is found that the colored resin compositions in Examples have a high ultraviolet (365 nm) transmittance and excellent sensitivity. On the other hand, the colored resin compositions in Comparative Examples had a low ultraviolet (365 nm) transmittance and poor sensitivity, and in Comparative Examples 1 and 3, the pattern was missing in the alkali development after the exposure.

Example 9

In 128.9 g of a colorant dispersion (DC-1), 273.6 g of 35% by weight solution of PGMEA of an acrylic polymer (P-1), 67.1 g of dipentaerythritol hexaacrylate (manufactured by Nippon Kayaku Co., Ltd.) as a polyfunctional monomer, 1.7 g of "ADEKA ARKLS" (registered trademark) NCI-831 (manufactured by ADEKA Corporation) as a photopolymerization initiator, 3.0 g of KBM5103 (manufactured by Shin-Etsu Chemical Co., Ltd.) as an adhesion improving agent, and a solution obtained by dissolving 3 g of 10% by weight solution of PGMEA of a silicone surfactant "BYK" (registered trademark) 333 (manufactured by BYK-Chemie GmbH) in 522.8 g of PGMEA as a surfactant were added to obtain a negative photosensitive colored resin composition PC-12 having a total solid content concentration of 20% by weight and a colorant/resin (weight ratio) of 13/87.

The obtained colored resin composition PC-12 was applied on a non-alkali glass substrate (AN100) using a spinner (1H-DS) manufactured by MIKASA Co., Ltd., and the resulting coating film was heat-dried on a hot plate at 100° C. for 2 minutes. The dry film was exposed to ultraviolet rays with an exposure amount of 200 mJ/cm² with a negative mask manufactured by HOYA CORPORATION (stripe design line width 50 μm) adhered to the dry film using a mask aligner (PEM-6M) manufactured by Union Optical Co., Ltd. Next, the exposed film was developed using an alkaline developing solution of 0.045% by weight of potassium hydroxide aqueous solution and then washed with pure water to obtain a patterning substrate. The obtained patterning substrate was post-baked in a hot air oven at 230° C. for 30 minutes to obtain a colored film C-12. Table 3 shows the results of evaluating the colored film C-12 having film thicknesses of 10 μm and 20 μm after the post-baking.

Example 10

A negative photosensitive colored resin composition PC-13 was obtained in the same manner as in Example 9 except that 212.8 g of a cardo resin V-259ME (manufactured by NIPPON STEEL & SUMITOMO METAL CORPORATION, 45% by weight solution of PGMEA) (P-2) was used instead of 273.6 g of 35% by weight solution of PGMEA of an acrylic polymer (P-1). The obtained colored resin composition PC-13 was used to evaluate in the same manner as in Example 9. The results are shown in Table 3.

Example 11

In 49.5 g of a colorant dispersion (DC-1), 241.7 g of a cardo resin V-259ME (manufactured by NIPPON STEEL & SUMITOMO METAL CORPORATION, 45% by weight solution of PGMEA) (P-2), 73.7 g of dipentaerythritol hexaacrylate (manufactured by Nippon Kayaku Co., Ltd.) as a polyfunctional monomer, 1.8 g of "ADEKA ARKLS" (registered trademark) NCI-831 (manufactured by ADEKA Corporation) as a photopolymerization initiator, 3.0 g of KBM5103 (manufactured by Shin-Etsu Chemical Co., Ltd.) as an adhesion improving agent, and a solution obtained by dissolving 3 g of 10% by weight solution of PGMEA of a silicone surfactant "BYK" (registered trademark) 333 (manufactured by BYK-Chemie GmbH) in 627.3 g of PGMEA as a surfactant were added to obtain a negative photosensitive colored resin composition PC-14 having a total solid content concentration of 20% by weight and a colorant/resin (weight ratio) of 5/95. The obtained colored resin composition PC-14 was used to evaluate in the same manner as in Example 9. The results are shown in Table 3.

Example 12

A negative photosensitive colored resin composition PC-15 was obtained in the same manner as in Example 10 except that a colorant dispersion (DC-3) was used instead of the colorant dispersion (DC-1). The obtained colored resin composition PC-15 was used to evaluate in the same manner as in Example 9. The results are shown in Table 3.

Comparative Example 4

A negative photosensitive colored resin composition PC-16 was obtained in the same manner as in Example 10 except that a colorant dispersion (DC-11) was used instead of the colorant dispersion (DC-1). The obtained colored resin composition PC-16 was used to evaluate in the same manner as in Example 9. The results are shown in Table 3.

TABLE 3

| | Colored resin composition | | | | | | Results of evaluating |
|---|---|---|---|---|---|---|---|
| | Colored resin composition | Resin (A) | Colorant (B) | Organic solvent (C) | Polymer dispersant | Colorant/ resin ratio | colored film Light shielding property OD/μm |
| Example 9 | PC-12 | P-1 | Zirconia compound Zr-1 | PGMEA | LPN21116 | 13/87 | 0.5 |
| Example 10 | PC-13 | P-1 + P-2 | Zirconia compound Zr-1 | PGMEA | LPN21116 | 13/87 | 0.5 |
| Example 11 | PC-14 | P-1 + P-2 | Zirconia compound Zr-1 | PGMEA | LPN21116 | 5/95 | 0.2 |
| Example 12 | PC-15 | P-1 + P-2 | Zirconia compound Zr-4 | PGMEA | LPN21116 | 13/87 | 0.6 |
| Comparative Example 4 | PC-16 | P-1 + P-2 | Carbon black CB-1 | PGMEA | LPN21116 | 13/87 | 0.6 |

| | Results of evaluating colored film | | | | | |
|---|---|---|---|---|---|---|
| | Light transmissivity (Transmittance @365 nm) | Light transmissivity (Transmittance @550 nm) | Transmittance ratio 365 nm/550 nm | Flatness (Surface roughness) | Minimum resolution film thickness 10 μm | Minimum resolution film thickness 20 μm |
| Example 9 | 37% | 9% | 4.1 | 1.8 nm | 20 μm | Missing |
| Example 10 | 36% | 9% | 4.0 | 1.7 nm | 10 μm | 50 μm |
| Example 11 | 36% | 9% | 4.0 | 1.2 nm | 8 μm | 15 μm |
| Example 12 | 37% | 9% | 4.1 | 1.7 nm | 8 μm | 40 μm |
| Comparative Example 4 | 2% | 9% | 0.2 | 1.4 nm | Missing | Missing |

It is found that the colored resin compositions in Examples have a high ultraviolet (365 nm) transmittance and excellent sensitivity. Due to the high sensitivity, it is possible to form a pattern with high resolution even when the film is thick. It is also found that the resolution is improved by using a cardo resin as the alkali-soluble resin (A). On the other hand, the colored resin compositions in Comparative Examples had a low ultraviolet (365 nm) transmittance and poor sensitivity, and the pattern was missing in the alkali development after the exposure.

Example 13

In 170.0 g of a colorant dispersion (DC-6), 97.2 g of a polyamide ester resin (P-3), 28.6 g of the quinonediazide compound (b-1) obtained in Synthesis Example 3, 28.6 g of a phenolic compound bisphenol-AF (manufactured by Tokyo Chemical Industry Co., Ltd.), and a solution obtained by dissolving 3 g of 10% by weight solution of PGMEA of a silicone surfactant "BYK" (registered trademark) 333 (manufactured by BYK-Chemie GmbH) in 645.5 g of PGMEA were added to obtain a positive photosensitive colored resin composition PC-17 having a total solid content concentration of 20% by weight and a colorant/resin (weight ratio) of 17/83.

The obtained colored resin composition PC-17 was applied on a non-alkali glass substrate (AN100) using a spinner (1H-DS) manufactured by MIKASA Co., Ltd., and the resulting coating film was heat-dried on a hot plate at 100° C. for 2 minutes. The dry film was exposed with an exposure amount of 200 mJ/cm² through a positive mask manufactured by HOYA CORPORATION (stripe design line width 50 μm) using an i-line stepper (manufactured by Nikon Corporation, NSR-2005i9C). Next, the exposed film was developed using 2.38% by weight of tetramethylammonium (TMAH) aqueous solution (manufactured by MITSUBISHI GAS CHEMICAL COMPANY, INC., ELM-D) and then washed with pure water to obtain a patterning substrate. The obtained patterning substrate was post-baked in a hot air oven at 230° C. for 30 minutes to obtain a colored film C-17. Table 5 shows the results of evaluating the colored film C-17 by the method described above.

Example 14

A positive photosensitive colored resin composition PC-18 was obtained in the same manner as in Example 13 except that a colorant dispersion (DC-7) was used instead of the colorant dispersion (DC-6). The obtained colored resin composition PC-18 was used to evaluate in the same manner as in Example 13. The results are shown in Table 4.

Comparative Example 5

A positive photosensitive colored resin composition PC-19 was obtained in the same manner as in Example 13 except that a colorant dispersion (DC-12) was used instead of the colorant dispersion (DC-6). The obtained colored resin composition PC-19 was used to evaluate in the same manner as in Example 13. The results are shown in Table 4.

TABLE 4

| | Colored resin composition | | | | | | Results of evaluating |
|---|---|---|---|---|---|---|---|
| | Colored resin composition | Resin (A) | Colorant (B) | Organic solvent (C) | Polymer dispersant | Colorant/ resin ratio | colored film Light shielding property OD/μm |
| Example 13 | PC-17 | P-3 | Zirconia compound Zr-1 | PGMEA | BYK-2200 | 17/83 | 1.0 |
| Example 14 | PC-18 | P-3 | Zirconia compound Zr-4 | PGMEA | BYK-2200 | 17/83 | 1.1 |
| Comparative Example 5 | PC-19 | P-3 | Carbon black CB-1 | PGMEA | BYK-2200 | 17/83 | 1.3 |

| | Results of evaluating colored film | | | | | |
|---|---|---|---|---|---|---|
| | Light transmissivity (Transmittance @365 nm) | Light transmissivity (Transmittance @550 nm) | Transmittance ratio 365 nm/550 nm | Flatness (Surface roughness) | Minimum resolution film thickness 2 μm | Positive sensitivity |
| Example 13 | 45% | 10% | 4.5 | 1.8 nm | 6 μm | 120 mJ/cm² |
| Example 14 | 48% | 9% | 5.3 | 1.7 nm | 5 μm | 100 mJ/cm² |
| Comparative Example 5 | 2% | 9% | 0.2 | 1.7 nm | No resolution | Residue |

It is found that the colored resin compositions in Examples have a high ultraviolet (365 nm) transmittance and excellent sensitivity. Due to the high sensitivity, it is possible to form a pattern with high resolution in a positive black photosensitive composition. On the other hand, the colored resin composition in Comparative Example had a low ultraviolet (365 nm) transmittance and did not transmit ultraviolet rays to the bottom of the coating film, so that a residue was generated in the alkali development after the exposure of the coating film, and no pattern was formed.

Reference Example 1

Table 5 shows the results of the solvent resistance of the colored film C-1 prepared in Example 1.

Reference Example 2

A colored film C-20 was obtained in the same manner as in Example 1 except that the post-baking conditions of the colored film C-1 were changed from 230° C.×30 minutes to 100° C.×60 minutes. The obtained colored film C-20 was evaluated in the same manner as in Reference Example 1. The results are shown in Table 5.

Example 16

A colored film C-21 was obtained in the same manner as in Reference Example 2) except that the dry film was exposed through a non-alkali glass for 1.66 seconds using an LED lamp (GC-77) manufactured by Hamamatsu Photonics K.K. under the conditions of an output of 50% and an irradiation distance of 3 cm so that the i-line exposure amount was 500 mJ/cm$^2$ based on the pattern after the development in the colored film C-1. The obtained colored film C-21 was evaluated in the same manner as in Reference Example 1. The results are shown in Table 5.

Comparative Example 6

A colored film C-22 was obtained in the same manner as in Example 16 except that a colored resin composition (PC-9) was used instead of the colored resin composition (PC-1). The obtained colored film C-22 was evaluated in the same manner as in Reference Example 1. The results are shown in Table 5.

Comparative Example 7

A colored film C-23 was obtained in the same manner as in Example 16 except that a colored resin composition (PC-10) was used instead of the colored resin composition (PC-1). The obtained colored film C-23 was evaluated in the same manner as in Reference Example 1. The results are shown in Table 5.

Comparative Example 8

A colored film C-24 was obtained in the same manner as in Example 16 except that a colored resin composition (PC-11) was used instead of the colored resin composition (PC-1). The obtained colored film C-24 was evaluated in the same manner as in Reference Example 1. The results are shown in Table 5.

TABLE 5

| | Method for producing substrate with light-shielding pattern | | | | Results of evaluating colored film |
|---|---|---|---|---|---|
| | Colored resin composition | Exposure amount of pattern | Exposure after development | Calcining conditions | Light shielding property OD/μm |
| Reference Example 1 | PC-1 | 100 mJ/cm$^2$ | None | 230° C. × 30 min | 1.4 |
| Reference Example 2 | PC-1 | 100 mJ/cm$^2$ | None | 100° C. × 60 min | 1.4 |
| Example 16 | PC-1 | 100 mJ/cm$^2$ | Back-surface 500 mJ/cm$^2$ | 100° C. × 60 min | 1.4 |
| Comparative Example 6 | PC-9 | 100 mJ/cm$^2$ | Back-surface 500 mJ/cm$^2$ | 100° C. × 60 min | 0.8 |
| Comparative Example 7 | PC-10 | 100 mJ/cm$^2$ | Back-surface 500 mJ/cm$^2$ | 100° C. × 60 min | 1.9 |
| Comparative Example 8 | PC-11 | 100 mJ/cm$^2$ | Back-surface 500 mJ/cm$^2$ | 100° C. × 60 min | 1.7 |

| | Results of evaluating colored film | | | | Solvent resistance |
|---|---|---|---|---|---|
| | Light transmissivity (Transmittance @365 nm) | Light transmissivity (Transmittance @550 nm) | Transmittance ratio 365 nm/550 nm | OD value after calcining | OD value after wiping with PGMEA |
| Reference Example 1 | 40% | 9% | 4.4 | 4.0 | 4.0 |
| Reference Example 2 | 40% | 9% | 4.4 | 4.0 | 2.8 |
| Example 16 | 40% | 9% | 4.4 | 4.0 | 3.8 |
| Comparative Example 6 | 4% | 8% | 0.5 | 4.0 | 2.2 |
| Comparative Example 7 | 15% | 9% | 1.7 | 4.0 | 2.6 |
| Comparative Example 8 | 2% | 9% | 0.2 | 4.0 | 1.2 |

It is found that the light-shielding patterns produced by the production methods in Examples have a small reduction rate of the light shielding property within 20% even after wiped with PGMEA, and are excellent in solvent resistance. On the other hand, the light-shielding patterns produced by the production methods in Comparative Examples were insufficiently photocured, had a reduction rate of the light shielding property larger than 20% after wiped with PGMEA, and were poor in solvent resistance.

The colored resin composition according to the present invention can be suitably used for forming a colored film that transmits ultraviolet rays.

The invention claimed is:

1. A colored resin composition comprising:
   an alkali-soluble resin (A);
   a colorant (B);
   an organic solvent (C); and
   a photosensitizer (D), the colored resin composition comprising at least a zirconia compound particle as the colorant (B), wherein the zirconia compound particle contains zirconium nitride having a crystallite size of 10 nm or more and 60 nm or less, the crystallite size being determined from a half width of a peak derived from a (111) plane in an X-ray diffraction spectrum using a CuKα ray as an X-ray source,
   wherein the zirconia compound particle contains a composite particle including zirconium nitride and an aluminum metal particle, and
   wherein a content of the aluminum metal particle in the zirconia composite particle is 2% by mass or more and 20% by mass or less.

2. The colored resin composition according to claim 1, wherein the zirconia compound particle has a specific surface area of more than 20.0 m²/g.

3. The colored resin composition according to claim 1, wherein the zirconia compound particle is produced by a thermal plasma method.

4. The colored resin composition according to claim 1, further comprising a purple colorant as the colorant (B).

5. The colored resin composition according to claim 1, wherein when a colored film including the colored resin composition is formed to have an optical density (OD value) of 1, the colored film has a light transmittance of 20% or more at a wavelength of 365 nm.

6. The colored resin composition according to claim 1, comprising a photopolymerization initiator as the photosensitizer (D), and further comprising a radically polymerizable compound (E).

7. The colored resin composition according to claim 1, comprising a photoacid generator as the photosensitizer (D).

8. A colored film comprising a cured product of the colored resin composition according to claim 1.

9. A method for producing a substrate with a light-shielding pattern, the method comprising the steps of:
   applying the colored resin composition according to claim 1 on a transparent substrate to obtain a coating film;
   drying the obtained coating film to obtain a dry film;
   exposing and developing the obtained dry film to pattern the obtained dry film in a desired shape; and
   exposing the obtained pattern through the transparent substrate.

10. A color filter comprising the colored film according to claim 8.

11. A liquid crystal display device comprising the color filter according to claim 10.

12. A colored partition comprising the colored film according to claim 8.

13. A solid-state imaging device comprising the colored partition according to claim 12.

14. A display device comprising a color conversion material between the colored partitions according to claim 12.

* * * * *